(12) United States Patent
Tamaru et al.

(10) Patent No.: US 7,078,815 B2
(45) Date of Patent: Jul. 18, 2006

(54) SEMICONDUCTOR INTEGRATED CIRCUIT DEVICE

(75) Inventors: Tsuyoshi Tamaru, Hachioji (JP); Kazutoshi Oomori, Ome (JP); Noriko Miura, Ome (JP); Hideo Aoki, Musashimurayama (JP); Takayuki Oshima, Ome (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/056,224

(22) Filed: Feb. 14, 2005

(65) Prior Publication Data

US 2005/0151262 A1 Jul. 14, 2005

Related U.S. Application Data

(62) Division of application No. 10/214,579, filed on Aug. 9, 2002, now Pat. No. 6,856,019.

(30) Foreign Application Priority Data

Aug. 10, 2001 (JP) ............................. 2001-244152

(51) Int. Cl.
*H01L 23/48* (2006.01)
*H01L 21/4763* (2006.01)

(52) U.S. Cl. ...................... 257/760; 257/640; 257/649; 257/758; 438/622; 438/624; 438/724; 438/769

(58) Field of Classification Search ..................... None
See application file for complete search history.

(56) References Cited

U.S. PATENT DOCUMENTS

| 6,400,023 | B1 | 6/2002 | Huano |
| 6,507,081 | B1 | 1/2003 | Smith et al. |
| 6,646,351 | B1 | 11/2003 | Watanabe et al. |
| 2001/0045651 | A1 | 11/2001 | Saito et al. |
| 2002/0013062 | A1 | 1/2002 | Shimizu et al. |

FOREIGN PATENT DOCUMENTS

JP 2002-277520 A 10/2000

*Primary Examiner*—David Nelms
*Assistant Examiner*—Long Tran
(74) *Attorney, Agent, or Firm*—Antonelli, Terry, Stout and Kraus, LLP.

(57) ABSTRACT

A semiconductor integrated circuit device has a semiconductor substrate, an interlayer insulating film including SiOF films formed on a main surface of the semiconductor substrate, a wiring groove formed by dry etching of the interlayer insulating film, and a Cu wiring buried in the wiring groove by a Damascene method, wherein a silicon oxynitride film is provided between a silicon nitride film serving as an etching stopper layer for the dry etching and the SiOF film, so that free F generated in the SiOF film is trapped with the silicon oxynitride film.

14 Claims, 20 Drawing Sheets

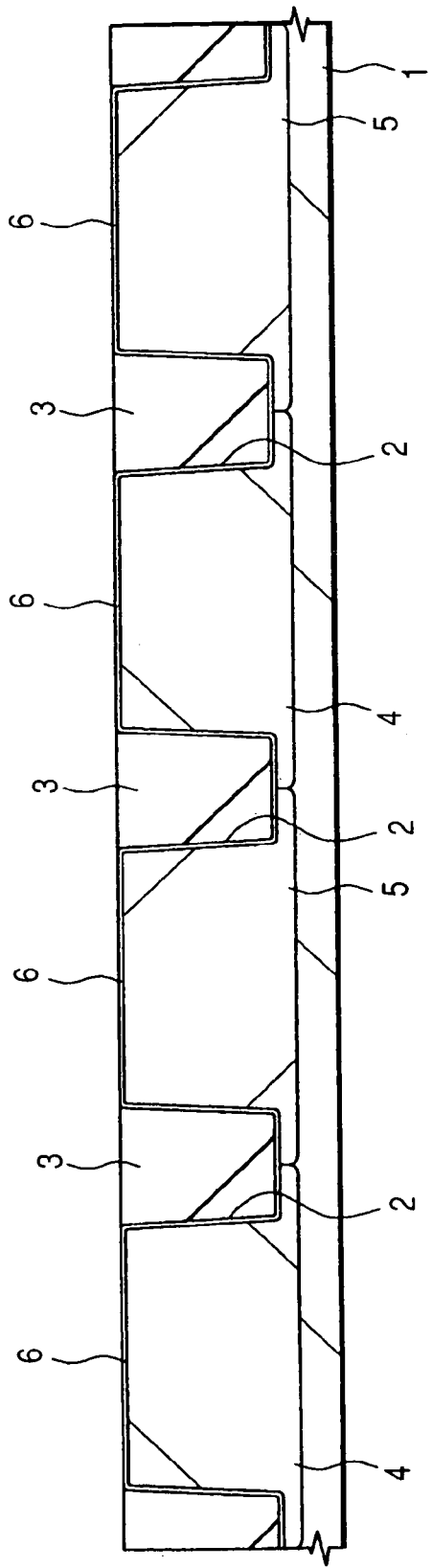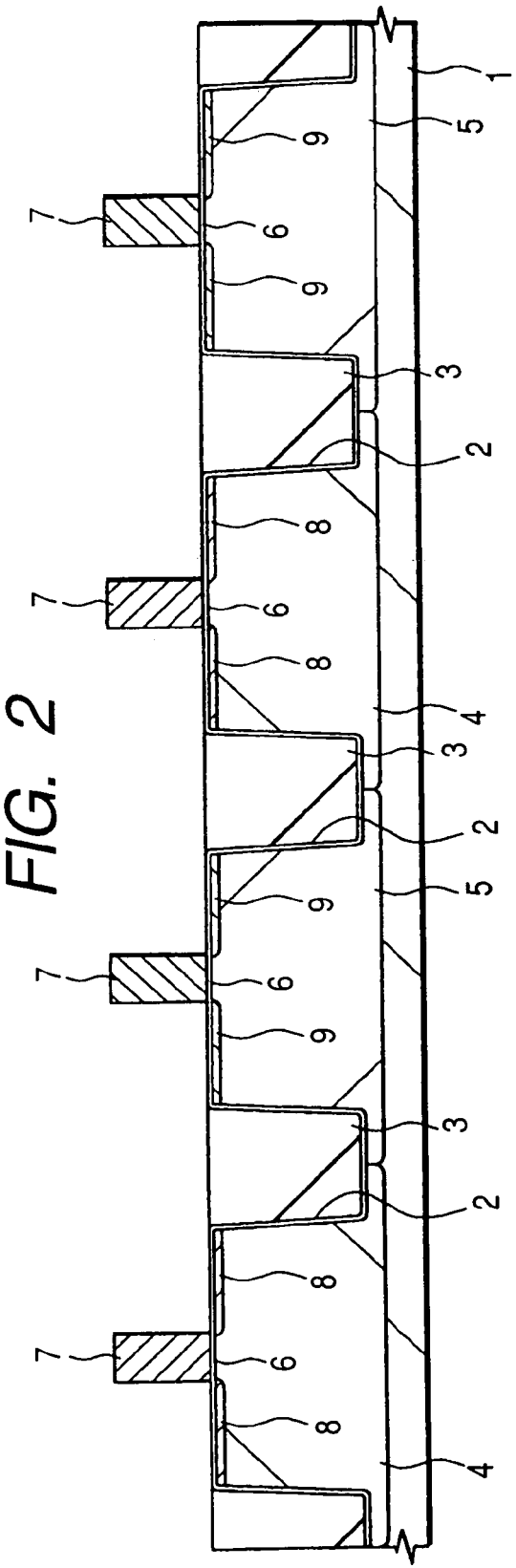

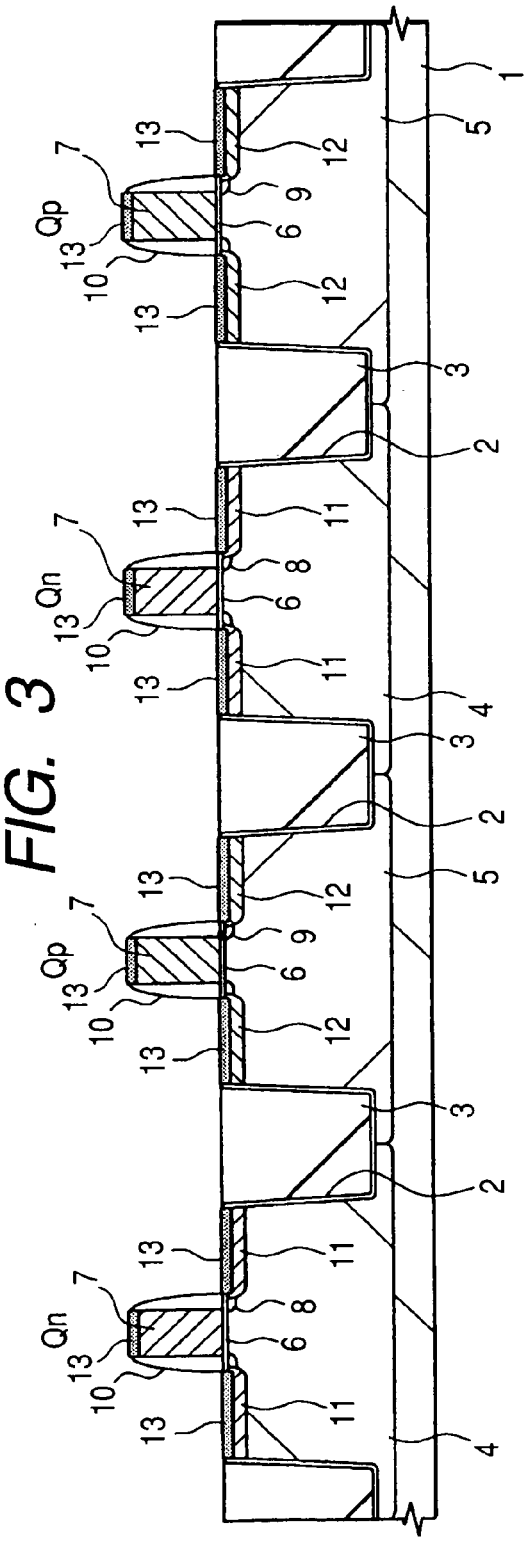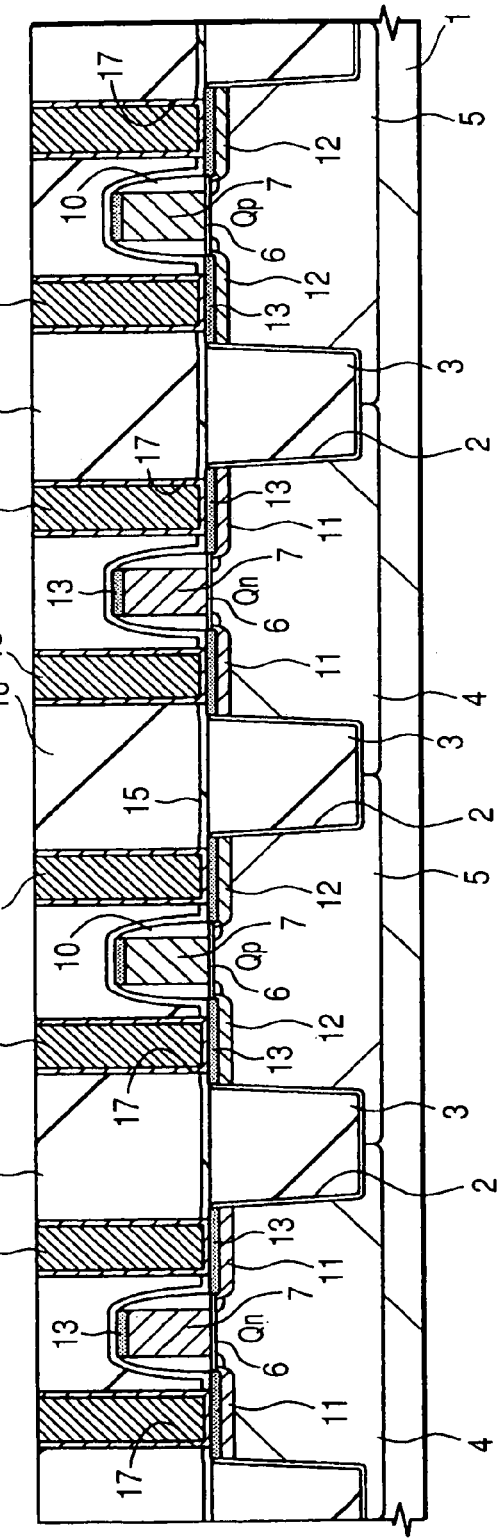

FIG. 15

SEMICONDUCTOR INTEGRATED CIRCUIT DEVICE

CROSS-REFERENCE TO RELATED APPLICATIONS

This is a Divisional of application Ser. No. 10/214,579, filed Aug. 9, 2002 now U.S. Pat. No. 6,856,019, the entire disclosure of which is hereby incorporated by reference.

BACKGROUND OF THE INVENTION

This invention relates to a semiconductor integrated circuit device and also to a manufacturing technique thereof. More particularly, the invention relates to an effective technique for application to the formation of a copper (Cu) wiring by use of a Damascene method.

In recent years, with a reduction in the scale of wirings resulting from the high degree of integration of an LSI, the wiring resistance has increased significantly. Especially, with a high-performance logic LSI, an increase in the wiring resistance has become one of the great factors impeding realization of an increased high performance.

To cope with this, a buried Cu wiring has now been brought in by use of the so-called Damascene method, wherein a groove for wiring is formed in an interlayer insulating film on a silicon substrate and a Cu film is deposited over the interlayer insulating film, including the inside of the wiring groove, and this is followed by removing the unnecessary portion of the Cu film disposed outside of the wiring groove by use of a chemical mechanical polishing (CMP) method. Along with the reduction of the wiring resistance by the introduction of the above Cu wiring, the introduction of an interlayer insulating film using, for example, SiOF, whose dielectric constant is lower than that of a silicon oxide film, has been adopted from the standpoint of reducing the capacitance of the wiring.

Japanese Laid-open Patent Application No. Hei 2000-277520 discloses a technique of forming a buried Cu wiring, according to the Damascene method, inside a wiring groove formed in an interlayer insulating layer made of SiOF. An outline of this technique will be described below.

Initially, a silicon oxide film is deposited on a silicon substrate on which a transistor has been formed, and an SiOF film is subsequently deposited on the silicon oxide film through an etching stopper film. The etching stopper film on the silicon oxide film is used to prevent the lower silicon oxide film from being etched upon the formation of a groove for wiring by dry etching of the SiOF film. This etching stopper film is constituted of a material that is unlikely to be etched with the gas used for etching the SiOF film, e.g. a silicon nitride film or a silicon oxynitride (SiON) is used for this purpose.

Next, a groove for wiring is formed in the SiOF film by dry etching through a mask formed by a photoresist film. After formation of a thin barrier film and a sputtered Cu film over the SiOF, film including the inside of the wiring groove, a thick Cu film is further deposited thereon by an electroplating method or the like. The barrier film is formed so as to prevent the Cu in the wiring groove from being diffused into the SiOF film, thereby not adversely influencing the element characteristics. In this application, the barrier film is formed of a material that has good bonding to the SiOF film in order to prevent separation thereof at the interface with the SiOF film, e.g. the barrier film is constituted, for example, of tantalum nitride (TaN) having a nitrogen content of 30 to 60%. The sputtered Cu film functions as a seed film when a Cu film is grown according to an electroplating method. Next, an unnecessary portion of the Cu film, the sputtered Cu film and the barrier film on the SiOF film are removed by a chemical mechanical polishing method to form a Cu wiring inside the wiring groove.

SUMMARY OF THE INVENTION

We have studied a process of forming a Cu wiring in a wiring groove formed in an interlayer insulating film wherein an SiOF film is provided as the interlayer insulating film and a silicon nitride film is used as an etching stopper film. As a result, we have found that a phenomenon occurs in which separation takes place at the interface between the interlayer insulating film (SiOF film) and the etching stopper film (silicon nitride film).

In the above-stated laid-open application (Japanese Laid-open Patent Application No. 2000-277520), although reference is made to the problem of separation at the interface between the barrier film formed inside the wiring groove and the interlayer insulating film (SiOF film), separation at the interface between the interlayer insulating film (SiOF film) and the etching stopper film (silicon nitride film) is not referred to at all. This phenomenon has never been known in the art.

How separation takes place at the interface between the SiOF film and the silicon nitride film is not known yet. We believe that the reason for this as follows. For instance, when a part of the Si—F bonds in the SiOF film is cut off so as to generate free F, this free F moves toward the interface between the SiN film and the SiOF film and is trapped thereat, and it then reacts with moisture taken in the interlayer insulating film from the air, thereby forming HF. Thereafter, when a substrate is exposed to a high temperature atmosphere exceeding 400° C. in a subsequent thermal treating step, the HF expands to cause a separation at the interface.

An object of the present invention is to provide a technique for effectively preventing separation at the interface between an etching stopper layer and an SiOF film used for the formation of a groove for a buried wiring by dry etching of the SiOF film in a semiconductor integrated circuit device having a buried wiring formed in an interlayer insulating film including the SiOF film.

The above and other objects and novel features of the present invention will become apparent from the following description with reference to the accompanying drawings.

Typical embodiments of the invention are briefly described below.

The semiconductor integrated circuit device according to the invention comprises a semiconductor substrate, a first insulating film which is formed on a main surface of the semiconductor substrate and is made of fluorine-containing silicon oxide, a first wiring formed inside the first insulating film, a second insulating film which is formed over the first insulating film and the first wiring, respectively, and is made of silicon nitride, and a third insulating film that is interposed between the first insulating film and the second insulating film and is made of nitrogen-containing silicon oxide.

The semiconductor integrated circuit device can be manufactured by a method, which comprises the steps of:

(a) forming, on a main surface of a semiconductor substrate, a first interlayer insulating film including a first silicon nitride film, a first insulating film made of fluorine-containing silicon oxide, a second insulating film made of nitrogen-containing silicon oxide, a second silicon nitride film, a third insulating film made of fluorine-containing silicon oxide, a fourth insulating film made of nitrogen-containing silicon oxide, and a third silicon nitride film;

(b) removing the third silicon nitride film at a wiring groove-forming region thereof by dry etching using a first photoresist film as a mask;

(c) removing the fourth insulating film, the third insulating film, the second silicon nitride film, the second insulating film and the first insulating film at part of the wiring groove-forming region by dry etching using a second photoresist film as a mask;

(d) removing the fourth insulating film and the third insulating film at the wiring groove-forming region thereof by dry etching using the third silicon nitride film as a mask;

(e) removing the third silicon nitride film by dry etching and further removing the first silicon nitride film by dry etching to form a first wiring groove in the first interlayer insulating film at the wiring groove-forming region; and (f) forming a first conductive layer buried inside the wiring groove and removing the first conductive layer from outside of the wiring groove by a chemical mechanical polishing method, thereby forming a first wiring made of the first conductive layer inside the wiring groove.

In this method, it is preferred that the second and fourth insulating films have such compositions that a ratio of silicon to oxygen and nitrogen is stoichiometrically in excess.

Moreover, the nitrogen contents in the second and fourth insulating films are, respectively, at 5 atom % or below.

It is also preferred that the thickness of each of the second and fourth insulating films is 50 nm or over.

The first wiring should preferably be made of a conductive layer comprising copper as a major proportion thereof.

In the step (a) of the above method, after formation of the first insulating film, this first insulating film should preferably be flattened by a chemical mechanical polishing method on the surface thereof prior to the formation of the second insulating film.

Likewise, in the step (a), after the formation of the second insulating film, the second insulating film should preferably be flattened by a chemical mechanical polishing method prior to the formation of the second silicon nitride film.

The semiconductor integrated circuit device can also be manufactured by a method, which comprises the steps of:

(a) forming, on a main surface of a semiconductor substrate, a first interlayer insulating film including a first SiC film or a first SiCN film, a first insulating film made of fluorine-containing silicon oxide, a second insulating film made of nitrogen-containing silicon oxide, a second SiC film or a second SiCN film, a third insulating film made of fluorine-containing silicon oxide, a fourth insulating film made of nitrogen-containing silicon oxide, and a fifth insulating film made of SiC, SiCN or silicon nitride;

(b) removing the fifth insulating film at a wiring groove-forming region thereof by dry etching using a first photoresist film as a mask;

(c) removing the fourth insulating film, the third insulating film, the second SiC film or the second SiCN film, the second insulating film and the first insulating film at part of the wiring groove-forming region by dry etching using a second photoresist film as a mask;

(d) removing the fourth insulating film and the third insulating film at the wiring groove-forming region thereof by dry etching using the fifth insulating film as a mask;

(e) removing the fifth film by dry etching and further removing the first SiC film or the first SiCN film by dry etching to form a first wiring groove in the first interlayer insulating film at the wiring groove-forming region; and (f) forming a first conductive layer buried inside the wiring groove and removing the first conductive layer from outside of the wiring groove by a chemical mechanical polishing method, thereby forming a first wiring made of the first conductive layer inside the wiring groove.

In the above method, it is preferred that the second and fourth insulating films have such compositions that a ratio of silicon to oxygen and nitrogen is stoichiometrically in excess.

Moreover, the nitrogen contents in the second and fourth insulating films are, respectively, at 5 atom % or below.

It is also preferred that the thickness of each of the second and fourth insulating films is 50 nm or over.

The first wiring should preferably be made of a conductive layer comprising copper as a major proportion thereof.

In the step (a) of the above method, after formation of the first insulating film, this first insulating film should preferably be flattened by a chemical mechanical polishing method on the surface thereof prior to the formation of the second insulating film.

Likewise, in the step (a), after the formation of the second insulating film, the second insulating film should preferably be flattened by a chemical mechanical polishing method prior to the formation of the second SiC or SiCN film.

Furthermore, the semiconductor integrated circuit device can also be manufactured by a method, which comprises the steps of:

(a) forming, on a main surface of a semiconductor substrate, a first interlayer insulating film including a first SiC film or a first SiCN film, a first insulating film made of fluorine-containing silicon oxide, a second SiC film or a second SiCN film, a second insulating film made of fluorine-containing silicon oxide, a third insulating film made of SiC, SiCN or silicon nitride;

(b) removing the third insulating film at a wiring groove-forming region thereof by dry etching using a first photoresist film as a mask;

(c) removing the second insulating film, the second SiC film or the second SiCN film, and the first insulating film at part of the wiring groove-forming region by dry etching using a second photoresist film as a mask;

(d) removing the second insulating film at the wiring groove-forming region thereof by dry etching using the third insulating film as a mask;

(e) removing the third insulating film by dry etching and further removing the first SiC film or the first SiCN film by dry etching to form a first wiring groove in the first interlayer insulating film at the wiring groove-forming region thereof; and (f) forming a first conductive layer buried inside the wiring groove and removing the first conductive layer from outside of the wiring groove by a chemical mechanical polishing method, thereby forming a first wiring made of the first conductive layer inside the wiring groove.

In this case, it is preferred that the first buried wiring is made of a conductive film comprising copper as a major proportion.

BRIEF DESCRIPTION OF THE ACCOMPANYING DRAWINGS

FIG. 1 is a sectional view of a part of a semiconductor substrate showing a step in the method of manufacture of a semiconductor integrated circuit device according to one embodiment of the invention;

FIG. 2 is a sectional view of a part of a semiconductor substrate showing a step in the method of manufacture of a semiconductor integrated circuit device according to one embodiment of the invention;

FIG. 3 is a sectional view of a part of a semiconductor substrate showing a step in the method of manufacture of a semiconductor integrated circuit device according to one embodiment of the invention;

FIG. 4 is a sectional view of a part of a semiconductor substrate showing a step in the method of manufacture of a semiconductor integrated circuit device according to one embodiment of the invention;

FIG. 15 is a sectional view of a part of a semiconductor substrate showing a step in the method of manufacture of a semiconductor integrated circuit device according to one embodiment of the invention;

Figure 21:
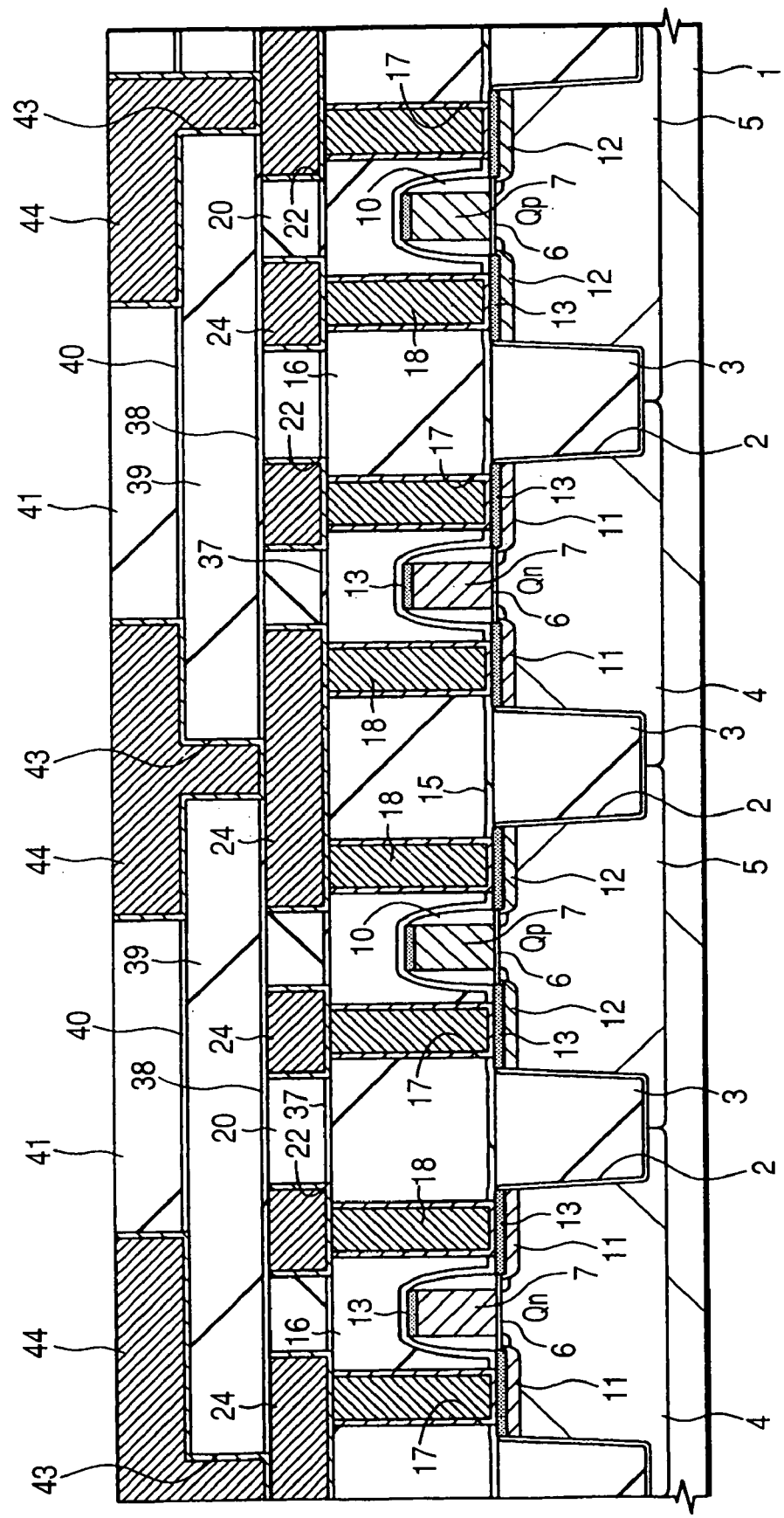
Figure 22:
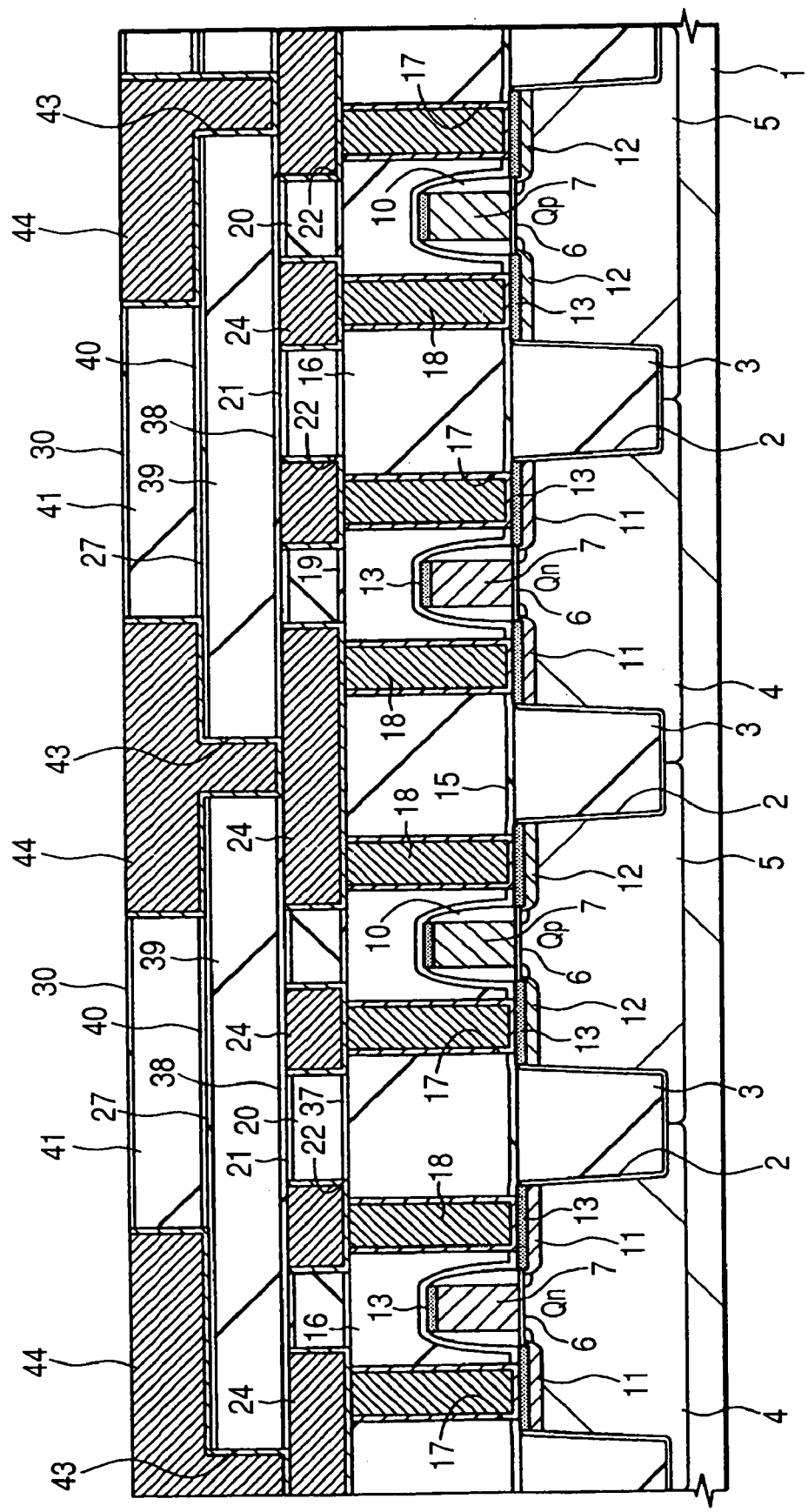

FIG. 21 is a sectional view of a part of a semiconductor substrate showing a step in the method of manufacture of a semiconductor integrated circuit device according to a second embodiment of the invention; and FIG. 22 is a sectional view of a part of a semiconductor substrate showing a step in the method of manufacture of a semiconductor integrated circuit device according to a second embodiment of the invention.

DETAILED DESCRIPTION OF THE PREFERRED EMBODIMENTS

Various embodiments of the invention will be described in detail with reference to the accompanying drawings, in which like reference numerals indicate like parts or members and may not be repeatedly illustrated after having once appeared throughout the drawings.

Embodiment 1

A method which may be used for manufacturing a CMOS-LSI according to the invention will be described in the sequence of the steps thereof, with reference to FIGS. 1 to 14.

As shown in FIG. 1, an element isolation groove 2 is formed in a semiconductor substrate 1 (hereinafter referred to simply as a substrate or wafer), which is made, for example, of p-type single crystal silicon having a specific resistance of about 1 to 10 Ωcm. For the formation of the element isolation groove 2, the substrate 1 is etched at an element isolation region thereof to form a groove, and a silicon oxide film 3 is deposited over the substrate 1 including the inner portion of the groove by a CVD method, and that is followed by removing that portion of the silicon oxide film 3 disposed outside of the groove by chemical mechanical polishing.

Next, boron is ion implanted into a part of the substrate 1, and phosphorus is also ion implanted into another part, thereby forming a p-type well 4 and an n-type well 5, and this is followed by subjecting the substrate 1 to steam oxidation to form a gate oxide film 6 on the p-type well 4 and the n-type well 5, respectively.

Thereafter, as shown in FIG. 2, gate electrodes 7 are formed over the p-type well 4 and the n-type well 5, respectively. For the formation of the gate electrodes 7, a polysilicon film is deposited, for example, on the gate oxide film 6 by a CVD method, after which phosphorus is ion implanted into the polysilicon film on the p-type well 4 and boron is ion implanted into the polysilicon film above the n-type well 5, and this is followed by patterning the polysilicon film by dry etching using a photoresist film as a mask.

Next, phosphorus or arsenic is ion implanted into the p-type well 4 to form an n-type semiconductor region 8 of a low impurity concentration, and boron is ion implanted into the n-type well 5 to form a p-type semiconductor region 9 of a low impurity concentration.

As shown in FIG. 3, a silicon nitride film is deposited on the substrate 1 by a CVD method and is anisotropically etched to form a side wall spacer 10 on side walls of the gate electrode 7. Thereafter, phosphorus or arsenic is ion implanted into the p-type well 4 to form n$^+$-type semiconductor regions 11 (source, drain) of a high impurity concentration and boron is ion implanted into the n-type well 5 to form p$^+$-type semiconductor regions 12 (source, drain) of a high impurity concentration.

Subsequently, after cleaning the substrate 1 on the surface thereof, a silicide layer 13 is formed on each of the surfaces of the gate electrode 7, the n$^+$-type semiconductor regions 11 (source, drain) and the p$^+$-type semiconductor regions 12 (source, drain). For the formation of the silicide layer 13, a Co (cobalt) film is deposited over the substrate 1 using a sputtering method and is thermally treated in an atmosphere of nitrogen gas to permit the substrate 1 and the gate electrode 7 to react with the Co film, and this is followed by removal of any unreacted Co film by wet etching. According to these steps, an n channel-type MIDFETQn and a p channel-type MISFETQp are completed.

Next, as shown in FIG. 4, a silicon nitride film 15 and a silicon oxide film 16 are deposited over the substrate 1 by a CVD method, and the silicon oxide film 16 and the silicon nitride film 15, formed over the n$^+$-type semiconductor regions 11 (source, drain) and the p$^+$-type semiconductor regions 12 (source, drain), are dry-etched to form contact holes 17, and this is followed by forming a metal plug 18 inside of each contact hole 17. For the etching of the silicon oxide film 16, a hydrofluorocarbon gas or a fluorocarbon gas, such as $CF_4$, $CHF_3$, $C_4F_8$ or the like, is used so as to reduce the etching rate of the lower silicon nitride film 15. When the silicon nitride film 15 is etched, a mixed gas of oxygen and Ar added to a hydrofluorocarbon gas ($CHF_3$, $CH_2F_2$ or the like) is used. For the formation of the metal plug 18, a TiN (titanium nitride) film and a W (tungsten) film are deposited over the silicon oxide film 16, including the inside of the contact hole 17, by a CVD method, and the unnecessary portions of the TiN film and the W film on the silicon oxide film 16 are removed by a chemical mechanical polishing (CMP) method or an etch back method. It will be noted that the silicon oxide film 16 may be formed not only of a silicon oxide film formed by an ordinary CVD method using monosilane ($SiH_4$) as a source gas, but also of a BPSG (boron-doped phosphosilicate glass) film, an SOG (spin on glass) film formed by a spin coating method, or a builtup film thereof.

Figure 5:
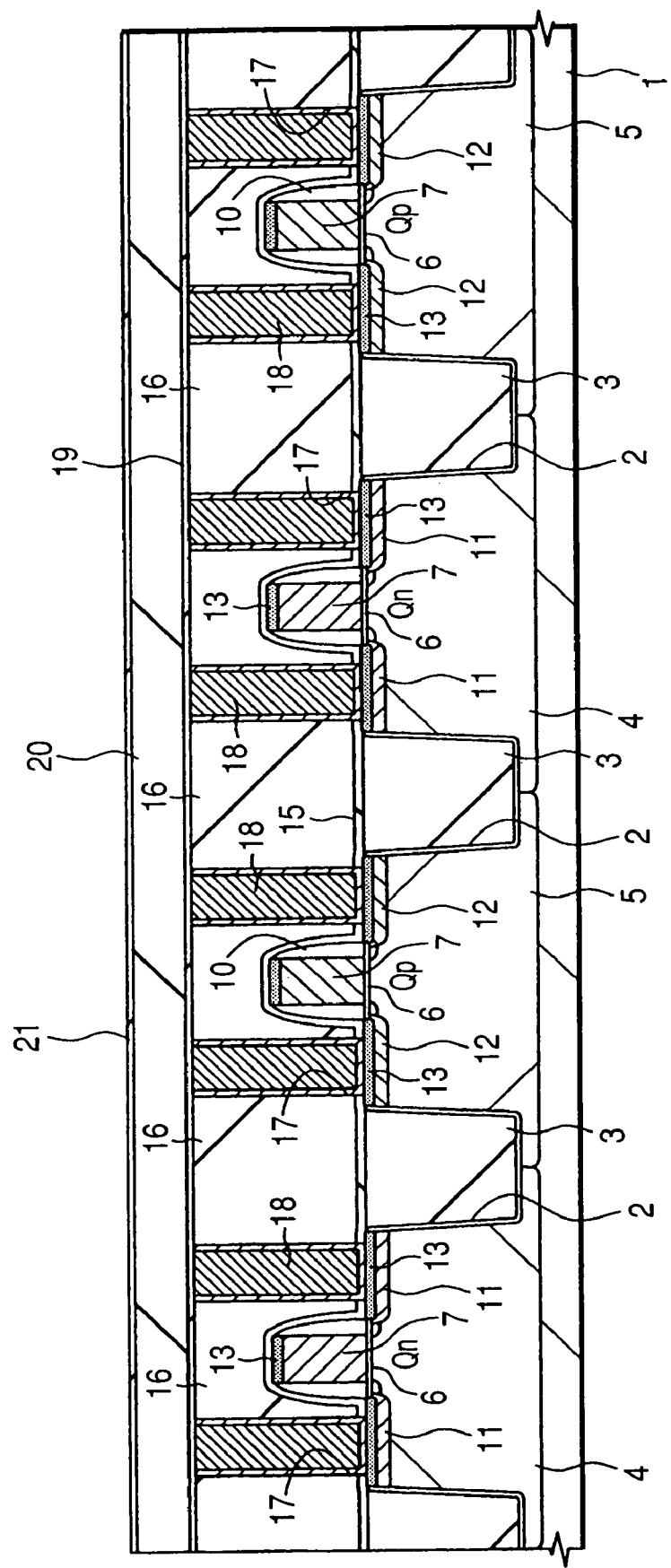
FIG. 5 is a sectional view of a part of a semiconductor substrate showing a step in the method of manufacture of a semiconductor integrated circuit device according to one embodiment of the invention.

Next, as shown in FIG. 5, a silicon nitride film 19, an SiOF film 20 and a silicon oxynitride (SiON) film 21 are successively deposited on the silicon oxide film 16. The silicon nitride film 19 serves as an etching stopper film for preventing the lower silicon oxide layer 16 from being etched upon the formation of a groove for wiring in the SiOF film 20 in a subsequent step, and it is deposited, for example, by a CVD method using, for example, a mixed gas made up of a silane gas, such as monosilane ($SiH_4$), disilane ($Si_2H_6$) or the like, with ammonia ($NH_3$) or nitrogen.

The SiOF film 20 is deposited by a plasma CVD method using, for example, a mixed gas of $SiH_4$, $SiF_4$ and oxygen or a mixed gas of tetraethoxysilane (($C_2H_5O)_4Si$), $SiF_4$ and oxygen. The SiOF film 20 has a relative dielectric constant (of about 3.5 to 3.7) smaller than silicon oxide (with a relative dielectric constant of 4.1), and it is able to reduce the capacitance of an interlayer insulating film provided between the Cu wirings formed in a subsequent step.

A silicon oxynitride film 21 is formed to prevent the SiOF film 20 and a silicon nitride (25) formed thereon in a subsequent step from being separated at the interface therebetween. The silicon oxynitride film 21 is deposited by a CVD method using, for example, a mixed gas made up of a silane gas, such as monosilane ($SiH_4$), disilane ($Si_2H_6$) or the like, an oxygen-containing gas, such as oxygen, nitrous oxide ($N_2O$), ozone ($O_3$) or the like, and a nitrogen-containing gas, such as nitrogen, $N_3$ or the like.

The reason why the formation of the silicon oxynitride film 21 between the SiOF film 20 and the silicon nitride film (25) formed on the film 20 prevents separation at the interface between the SiOF film 20a and the silicon nitride (25) is considered as follows.

The silicon oxynitride film 21 has a dangling bond of silicon (Si) therein, so that when a part of the Si—F bonds in the SiOF film 20 is cut off to cause free F to be generated, this free F is trapped with the dangling bond in the silicon oxynitride film 21 prior to arrival at the interface with the silicon nitride (25). If the dangling bonds are small in number, part of the free F reaches the interface with the silicon oxynitride film (25) where it is trapped. This lowers the bonding force at the interface between the silicon oxynitride film 21 and the silicon nitride film (25). More particularly, the number of dangling bonds existing in the silicon oxynitride should preferably be equal to or more than the number of free F's.

Accordingly, upon the formation of the silicon oxynitride film 21, it is preferred that the ratio of a silane gas to a nitrogen-containing gas and an oxygen-containing gas is made to be in excess so as to increase the number of dangling bonds. Where the silicon oxynitride film 21 is formed so as to be small in thickness, part of the free F is readily liable to reach the interface with the silicon nitride (25), for which it is preferred to keep a thickness of a certain level or over. A preferred thickness of the silicon oxynitride 21 is not unconditionally defined, because the amount of free F formed in the SiOF film 20 differs depending on the film-forming conditions and the film thickness. According to our experiment, a thickness of at least 50 nm is effective in preventing the separation. In addition, experimental results are also obtained which indicate that the nitrogen content in the silicon oxynitride film 21 is preferably within a range not exceeding 5 atom percent. A high nitrogen content results in a lower bonding force at the interface between the SiOF film 20 and the silicon oxynitride film 21 because the film quality of the silicon oxynitride film 21 comes close to that of the silicon nitride film 21.

Figure 6:
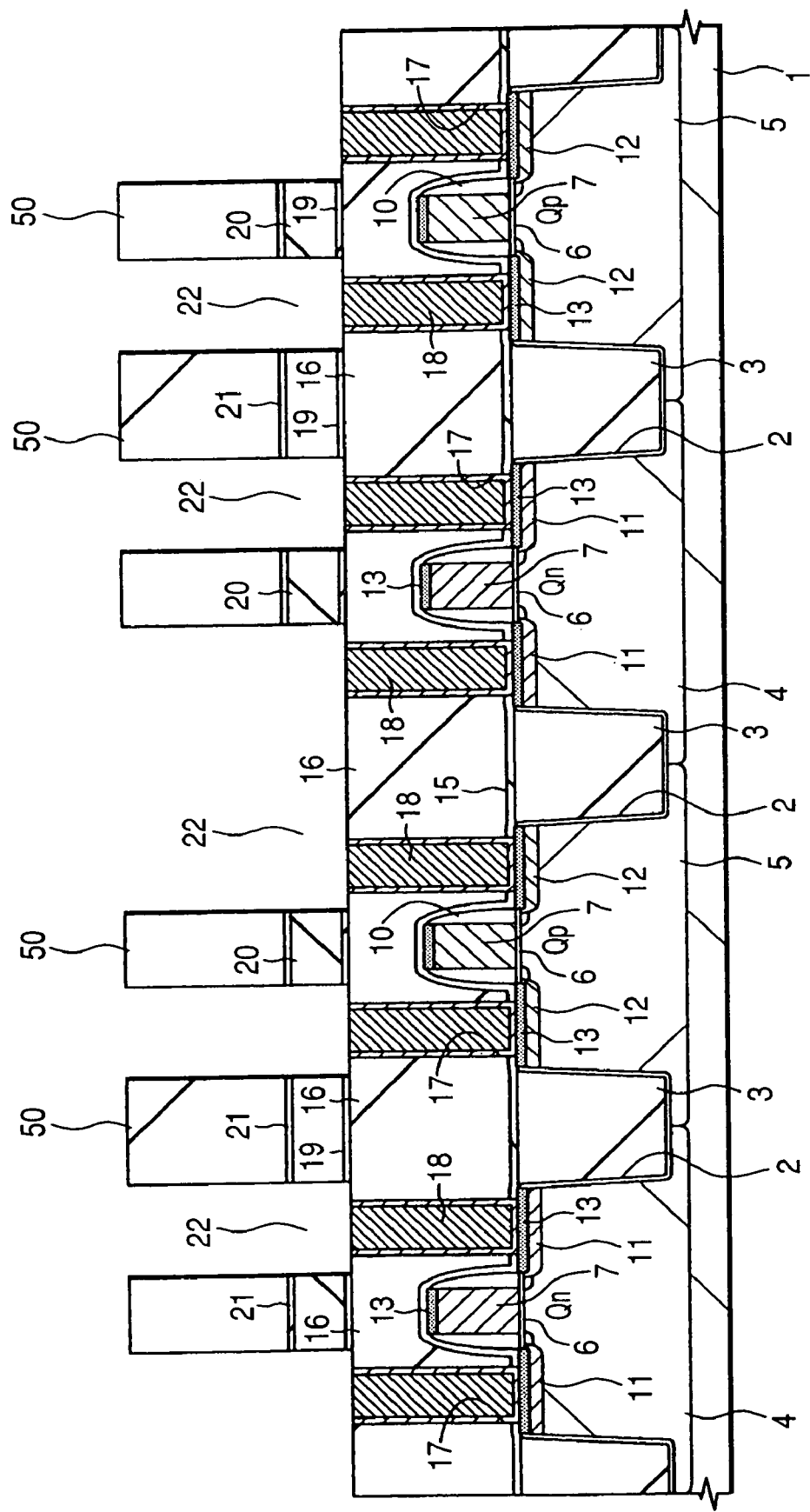
FIG. 6 is a sectional view of a part of a semiconductor substrate showing a step in the method of manufacture of a semiconductor integrated circuit device according to one embodiment of the invention.

Next, as shown in FIG. 6, the silicon oxynitride film 21, the SiOF film 20 and the silicon nitride film 19 are, successively, dry etched through a mask of a photoresist film 50, thereby forming a wiring groove 22 over the contact hole 17. For the etching of the silicon oxynitride film 21 and the SiOF film 20, a hydrofluorocarbon or fluorocarbon gas, such as $CF_4$, $CHF_3$, $C_4F_8$ or the like, is used so as to reduce the etching rate of the lower silicon nitride film 19. Moreover, for the etching of the silicon nitride film 19, a mixed gas of a hydrofluorocarbon gas, to which oxygen and Ar are added, is used for reducing the etching rate of the lower silicon oxide film 16.

Figure 7:
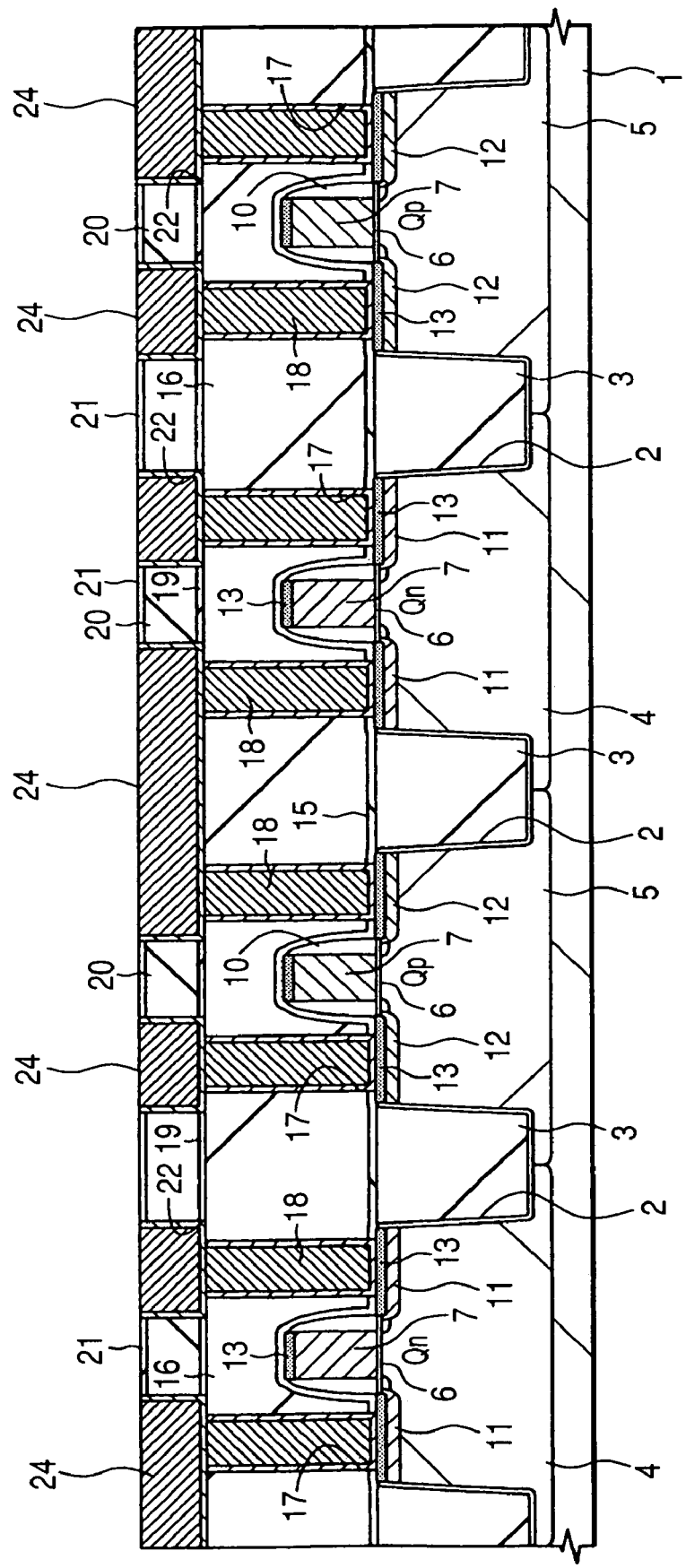
FIG. 7 is a sectional view of a part of a semiconductor substrate showing a step in the method of manufacture of a semiconductor integrated circuit device according to one embodiment of the invention.

Next, after removal of the photoresist film 50, a first-layer Cu wiring 24 is formed in the wiring groove 22, as shown in FIG. 7. The Cu wiring 24 is constituted of a builtup film of a barrier metal film and a Cu film and is formed in the following way. Initially, a barrier metal film and a Cu film are, respectively, deposited over the silicon oxynitride film 21, including the inner portion of the wiring groove 22, and this is followed by thermal treatment (reflow) in a non-oxidative atmosphere (e.g. in an atmosphere of hydrogen) to compactly bury the Cu film in the inside of the wiring groove 22. Thereafter, unnecessary portions of the Cu film and the barrier metal film disposed outside of the wiring groove 22 are removed by a chemical mechanical polishing method. For the polishing of the Cu film and the barrier metal film, a polishing slurry is used, which is obtained, for example, by dispersing or dissolving, in water, the main component of a grain, such as of alumina, and an oxidizing agent, such as an aqueous hydrogen peroxide solution or an aqueous ferric nitrate solution.

The barrier metal film has not only the function of preventing Cu in the Cu wiring 24 from diffusing into the SiOF film 20, but also the functions of improving the bonding between the Cu wiring 24 and the SiOF film 20 and also improving the wettability upon reflowing of the Cu film. The barrier metal films having such functions as mentioned above include, for example, a film of a high melting metal nitride, such as a TiN film, a WN (tungsten nitride) film, a TaN (tantalum nitride) film or the like, each deposited by a sputtering method, or a builtup film thereof, or a builtup film of TiN and Ti, or a built up film of Ta and TaN.

The Cu film serving as the Cu wiring 24 is formed by any of a sputtering method, a CVD method, and a plating method (an electroplating method or an electroless plating method). Where the plating method is used to form the Cu film, a seed layer made of a thin Cu film is formed beforehand on the surface of the barrier metal film by a sputtering method or the like, followed by growth of a Cu film on the surface of the seed layer. Moreover, where the Cu film is formed by a sputtering method, it is preferred to use a highly directional sputtering method, such as a long throw sputtering method or a collimate sputtering method. The Cu film may be formed not only of simple Cu, but also of a Cu alloy containing Cu as a major proportion.

Figure 8:
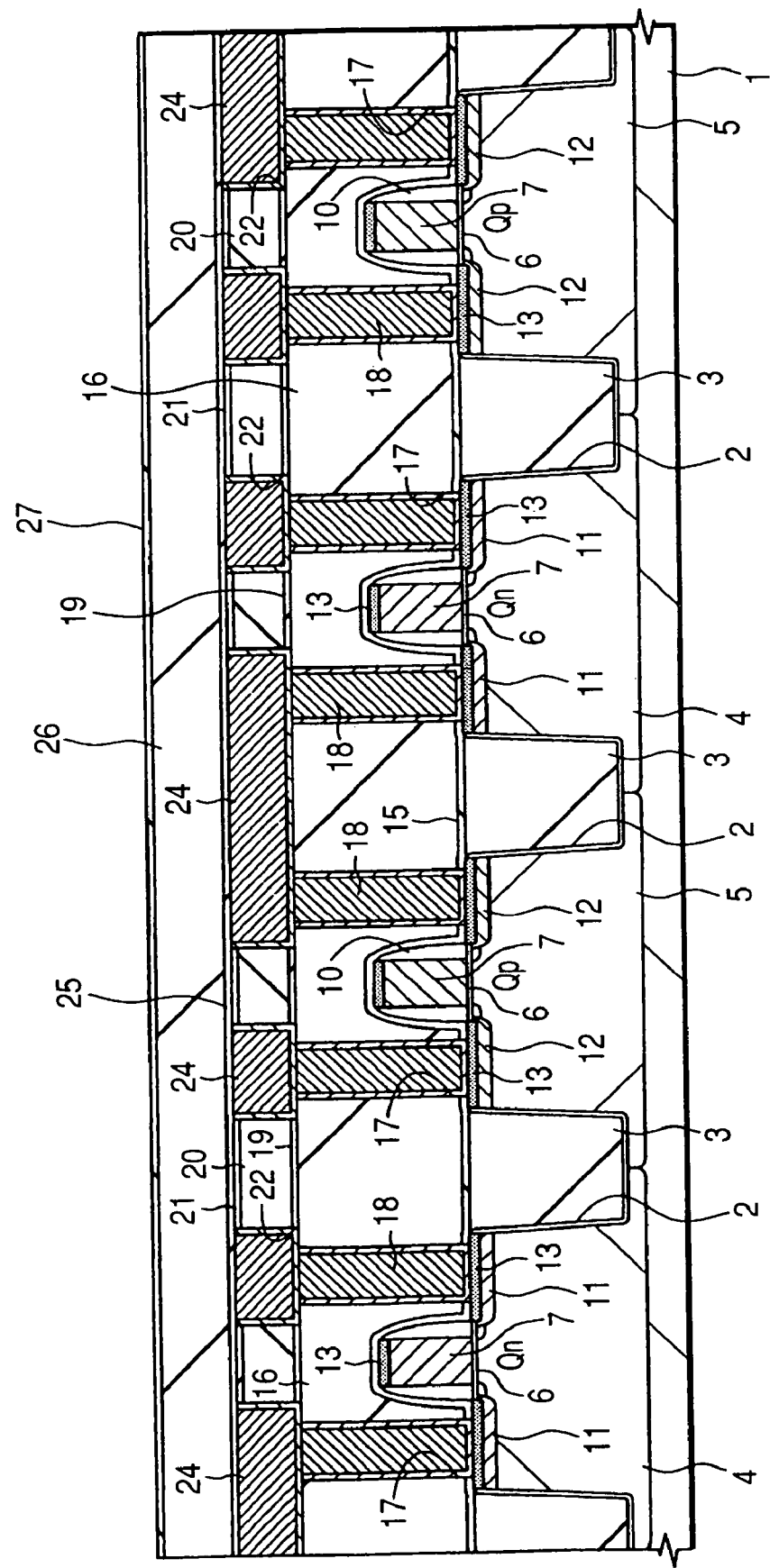
FIG. 8 is a sectional view of a part of a semiconductor substrate showing a step in the method of manufacture of a semiconductor integrated circuit device according to one embodiment of the invention.

Next, as shown in FIG. 8, a silicon nitride film 25, an SiOF film 26 and a silicon oxynitride film 27 are successively deposited over the Cu wiring 24 according to a CVD method, and this is followed by slightly polishing the silicon oxynitride film 27 by a chemical mechanical polishing method to flatten the surface thereof. In the course of carrying out the chemical mechanical polishing of the silicon oxynitride film 27, where there is concern that part of the lower SiOF film 26 will be exposed depending on the variation in abrasion in the in-plane surface of the wafer, the SiOF film 26 may be polished on the surface thereof after deposition thereof, followed by deposition of the silicon oxynitride film 27 on the SiOF film 26. The silicon nitride film 25 functions as a diffusion barrier layer for preventing Cu in the Cu wiring 24 from diffusing into the SiOF film 26. As stated hereinbefore, the silicon oxynitride film 21 is formed between the silicon nitride film 25 and the lower SiOF film 20, so that the separation at the interface between the silicon nitride film 25 and the lower SiOF film 20 can be prevented.

Figure 9:
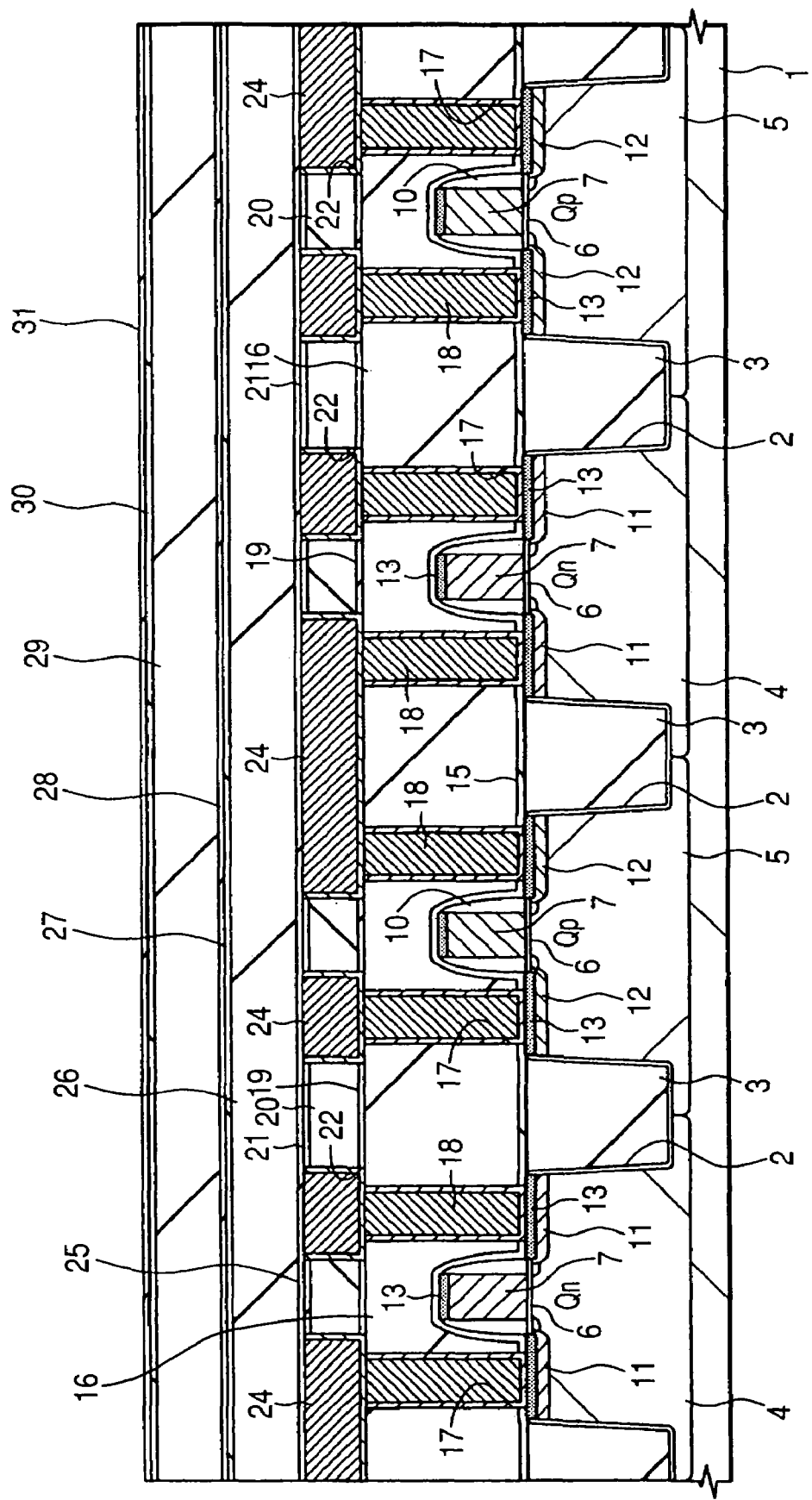
FIG. 9 is a sectional view of a part of a semiconductor substrate showing a step in the method of manufacture of a semiconductor integrated circuit device according to one embodiment of the invention.

Next, as shown in FIG. 9, a silicon nitride film 28, an SiOF film 29, a silicon oxynitride film 30 and a silicon nitride film 31 are successively deposited over the silicon oxynitride film 27 by a CVD method. The silicon nitride film 31 serves as a mask upon formation of a wiring groove (32) in a subsequent step. Since the silicon oxynitride film 30 is formed between the silicon nitride film 31 and the lower SiOF film 29, the separation at the interface between the silicon nitride film 28 and the SiOF film 26, and the separation at the interface between the silicon nitride film 31 and the SiOF film 29, can be prevented.

The silicon oxynitride films 27, 30 should preferably be made of a silicon-rich composition, respectively, like the silicon oxynitride film 21. Moreover, it is preferred that these films are deposited to a thickness of 50 nm or over and have a nitrogen content not exceeding 5 atom %.

Figure 10:
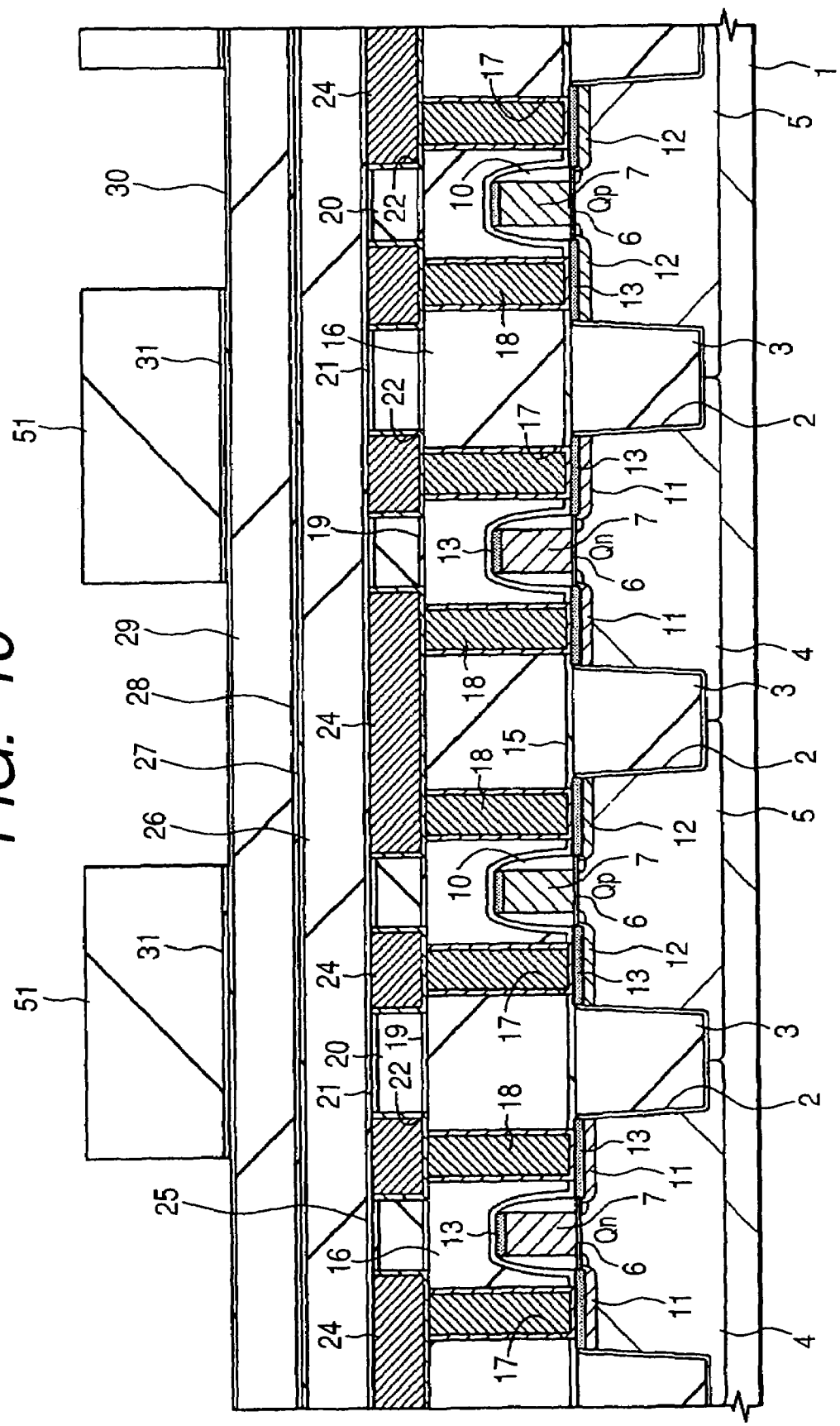
FIG. 10 is a sectional view of a part of a semiconductor substrate showing a step in the method of manufacture of a semiconductor integrated circuit device according to one embodiment of the invention.
Figure 11:
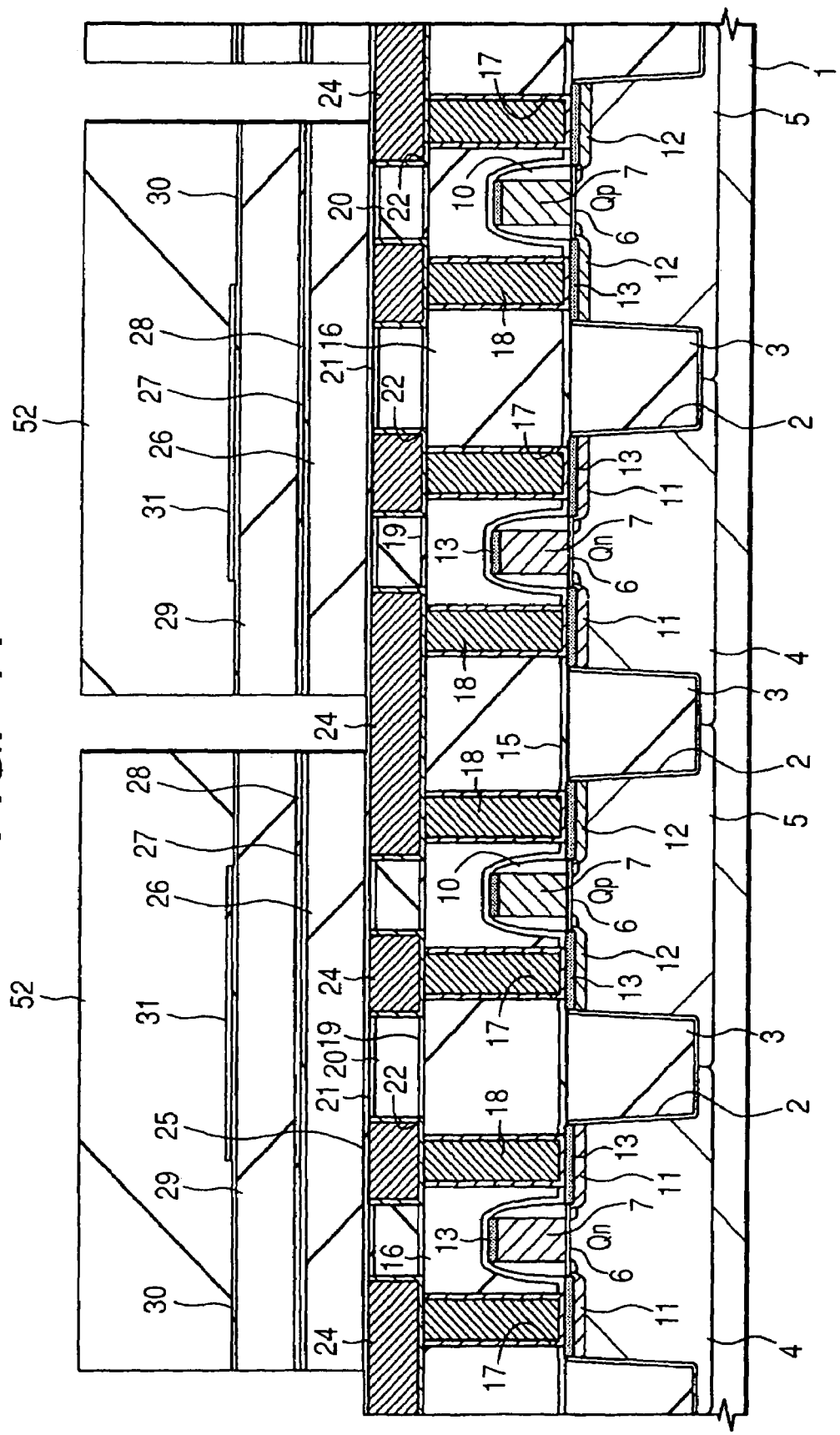
FIG. 11 is a sectional view of a part of a semiconductor substrate showing a step in the method of manufacture of a semiconductor integrated circuit device according to one embodiment of the invention.

Next, as shown in FIG. 10, the silicon nitride film 31 at the wiring groove-forming region is removed by dry etching using a photoresist mask 51. After removal of the photoresist film 51, the silicon oxynitride film 30, the SiOF film 29, the silicon nitride film 28, the silicon oxynitride film 27, and the SiOF film 26 at a part of the wiring groove-forming region are respectively removed by dry etching using the photoresist film 52 as a mask, and the etching is stopped the a surface of the silicon nitride film 25, as shown in FIG. 11.

Figure 12:
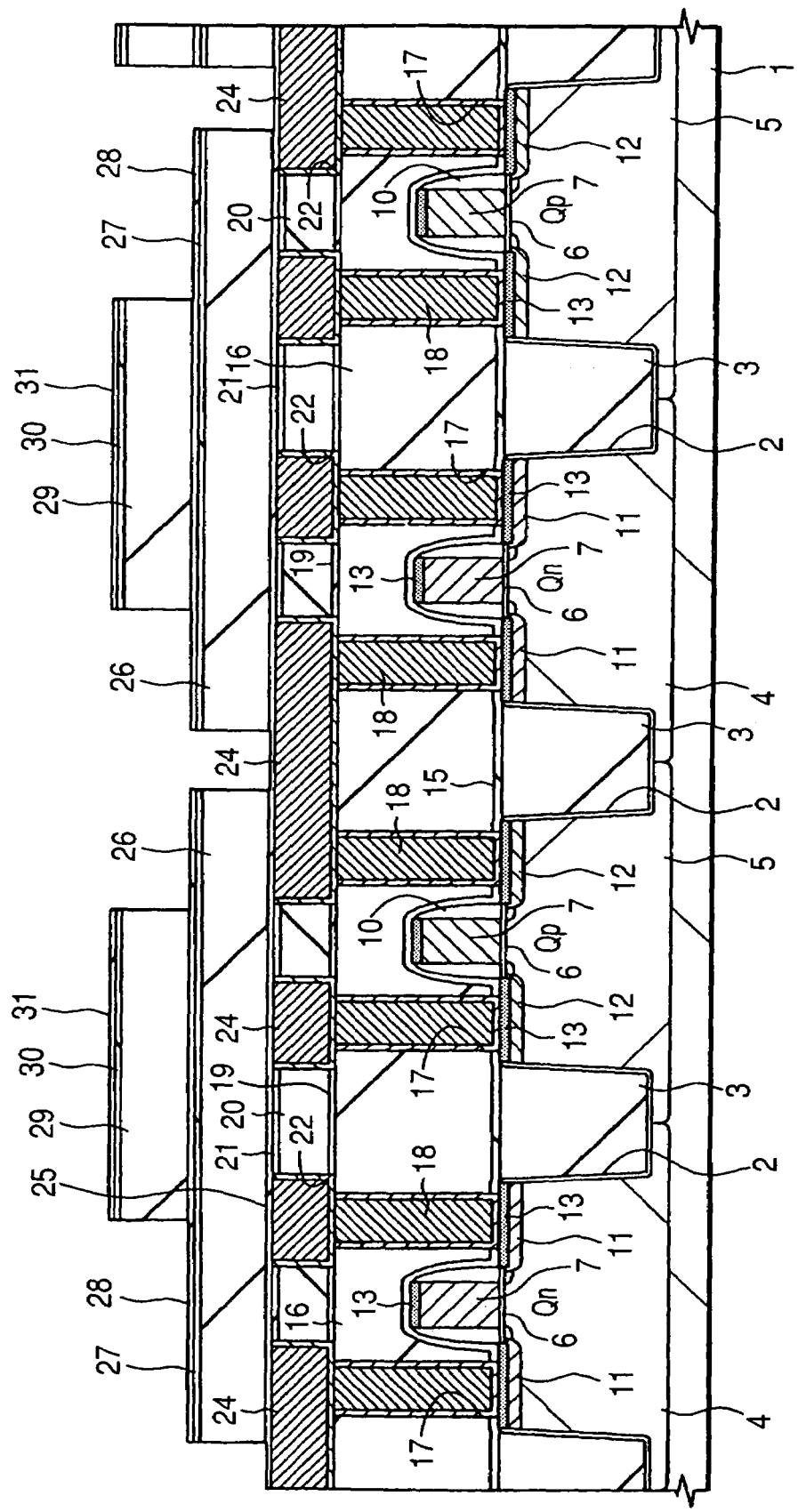
FIG. 12 is a sectional view of a part of a semiconductor substrate showing a step in the method of manufacture of a semiconductor integrated circuit device according to one embodiment of the invention.
Figure 13:
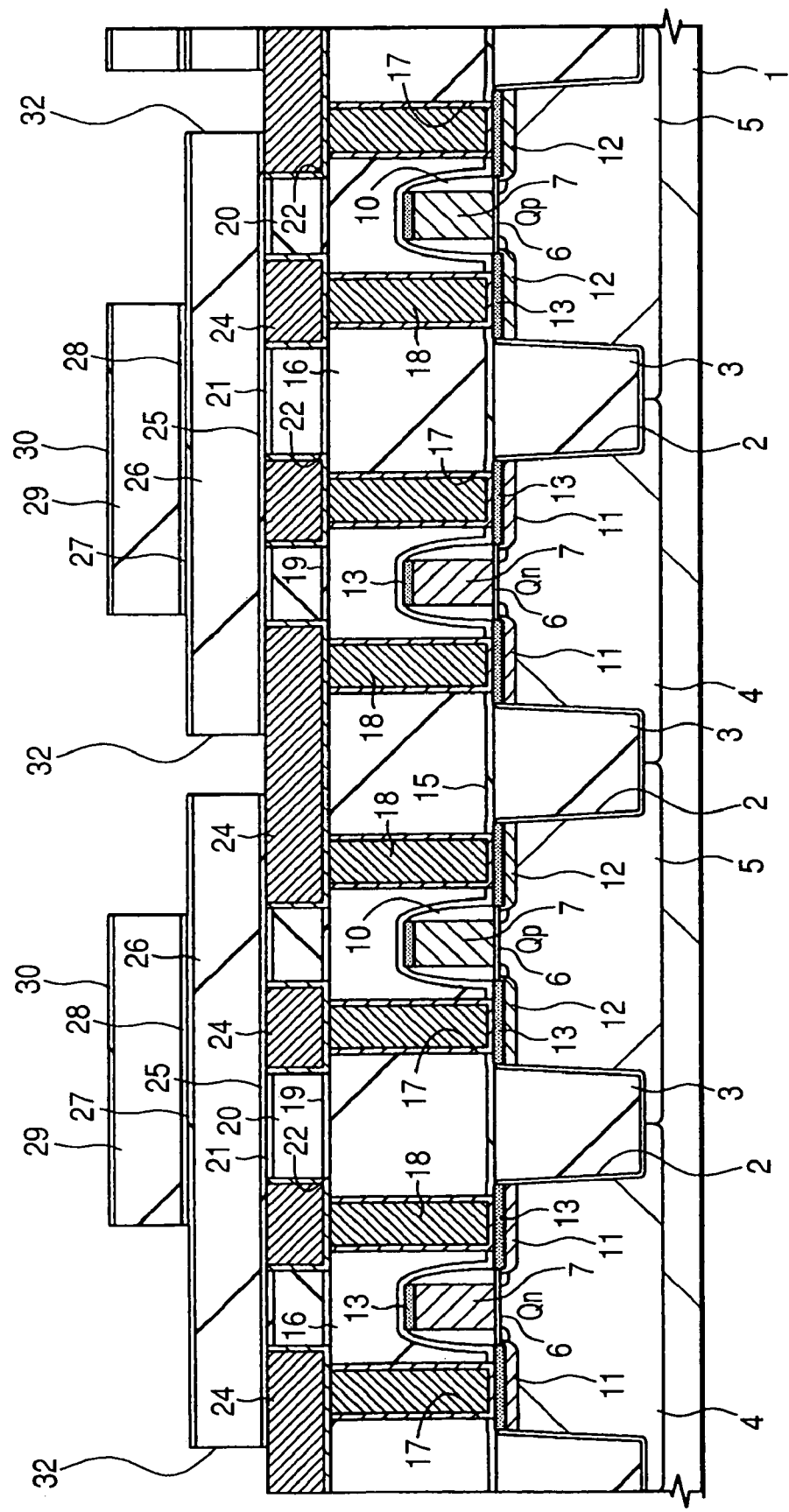
FIG. 13 is a sectional view of a part of a semiconductor substrate showing a step in the method of manufacture of a semiconductor integrated circuit device according to one embodiment of the invention.
Figure 14:
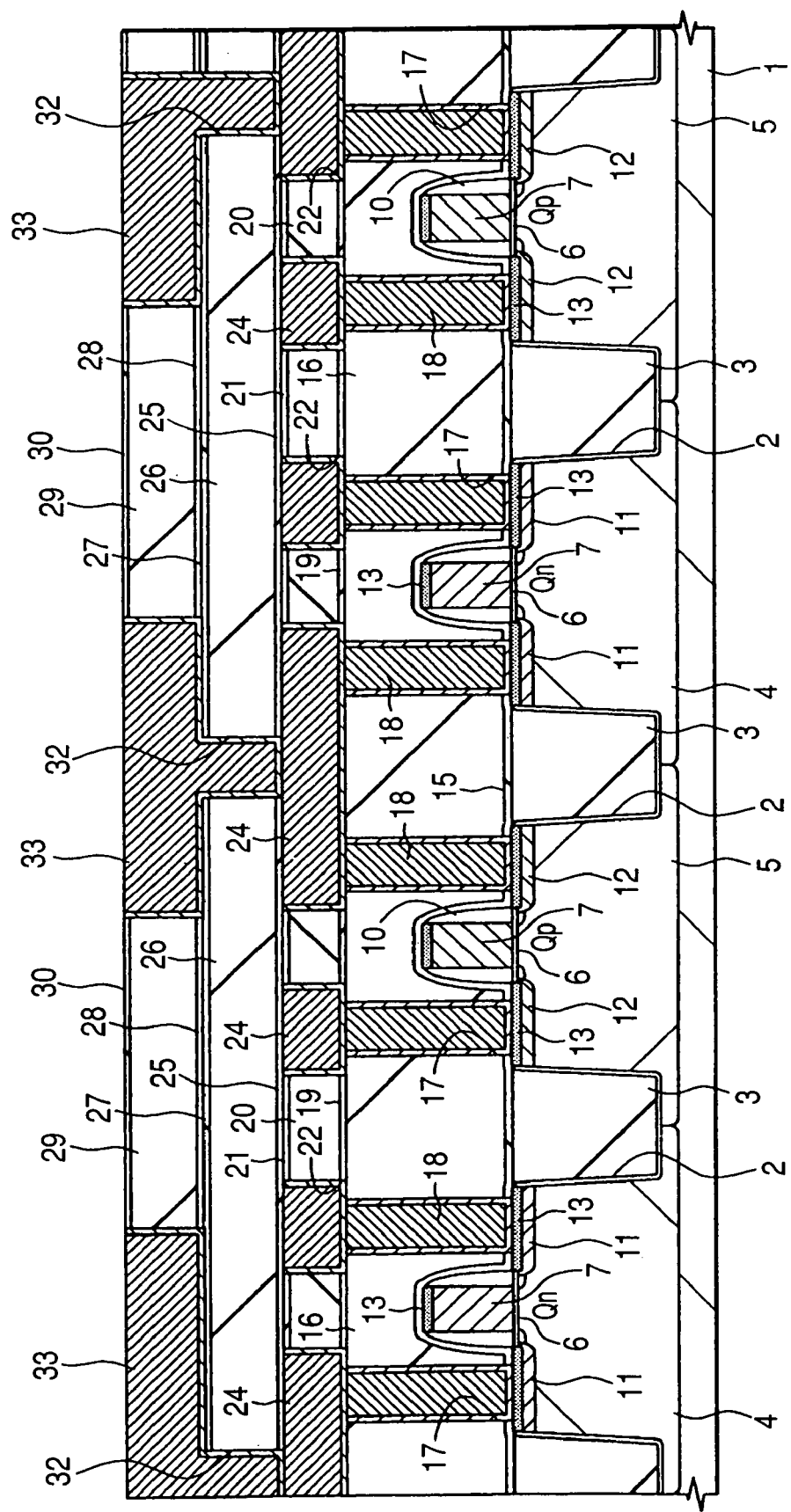
FIG. 14 is a sectional view of a part of a semiconductor substrate showing a step in the method of manufacture of a semiconductor integrated circuit device according to one embodiment of the invention.

Next, after removal of the photoresist film 51, the silicon oxynitride film 30 and the SiOF film 29 at the wiring groove-forming region are, respectively, removed by dry etching using the silicon nitride film 31 as a mask, as particularly shown in FIG. 12. Subsequently, as shown in FIG. 13, the silicon nitride films 31, 28 and 25 are subjected to dry etching to form a wiring groove 32 over the Cu wiring so as to form a second-layer Cu wiring in the wiring groove 32, as shown in FIG. 14. The second-layer Cu wiring may be formed according to the afore-stated method of forming the first-layer Cu wiring 24 (see FIG. 7).

Although not particularly shown, the above-stated steps are repeated to form a plurality of Cu wirings over the second-layer Cu wiring 33 to complete CMOS-LSI of this embodiment.

Figure 15:
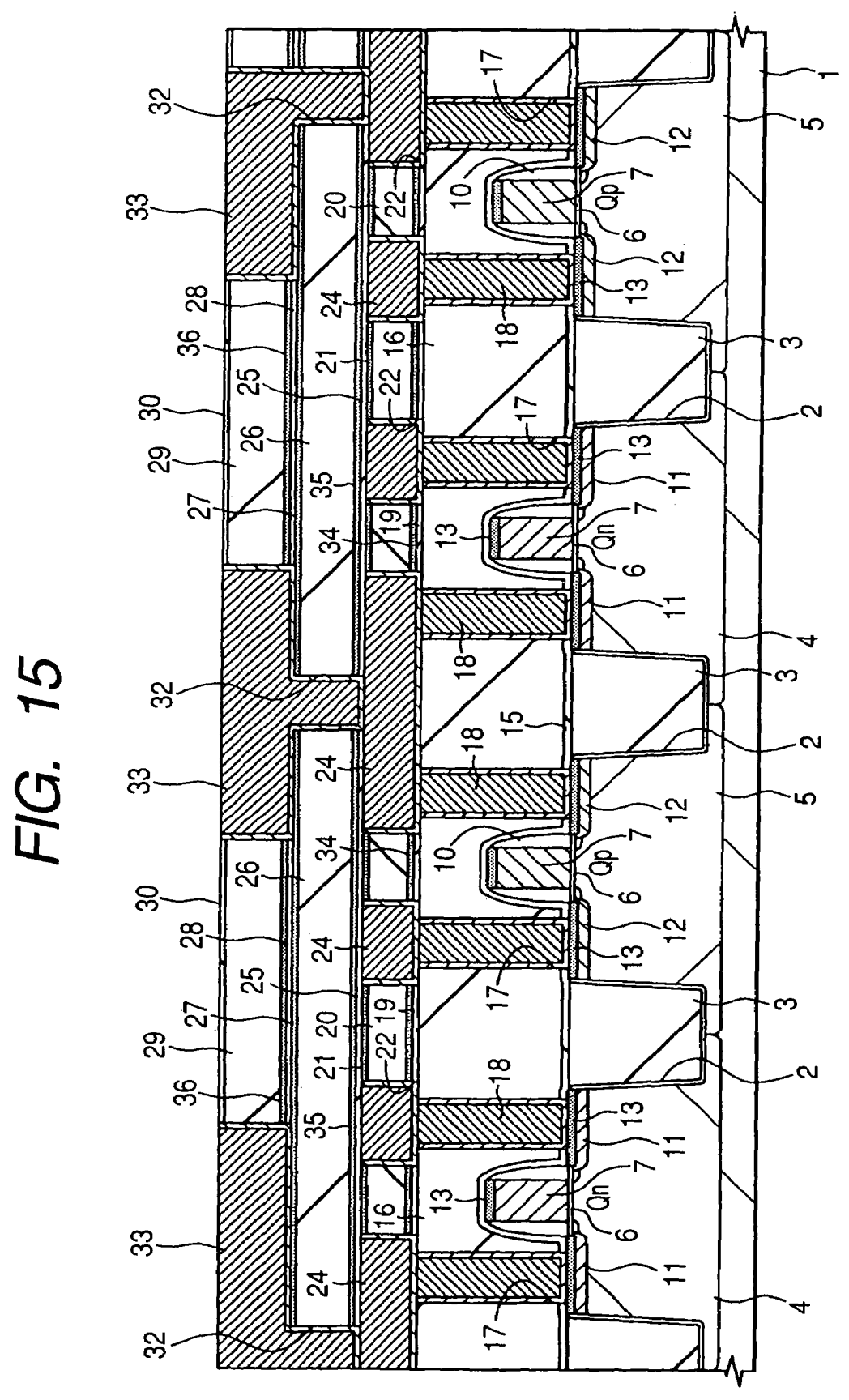

It will be noted that, in this embodiment, although the silicon oxynitride film 21 is interposed between the SiOF film 20 and the upper silicon nitride film 25, the silicon oxynitride film 34 may be interposed between the SiOF film 20 and the lower silicon nitride film 19, as shown in FIG. 15, thereby preventing the SiOF film 20 and the silicon nitride film 19 from becoming separated at the interface therebetween.

Embodiment 2

A method which may be used for manufacturing a CMOS-LSI according to this embodiment of the invention will be described in the sequence of the steps thereof with reference to FIGS. 16 to 21.

Figure 16:
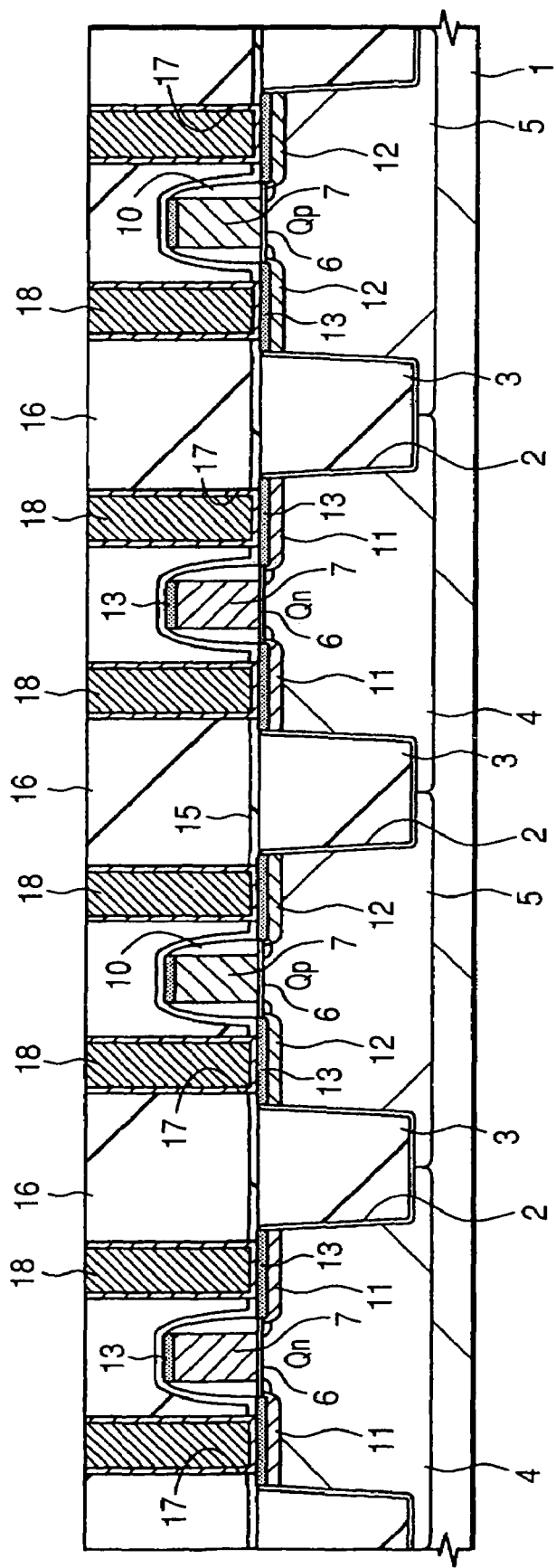
FIG. 16 is a sectional view of a part of a semiconductor substrate showing a step in the method of manufacture of a semiconductor integrated circuit device according to a second embodiment of the invention.

Initially, as shown in FIG. 16, after formation of an n-channel type MISFETQn and a p-channel type MISFETQp in the same manner as in Embodiment 1, a silicon oxide film 16 and a silicon nitride film 15, which are, respectively, formed over $n^+$-type semiconductor regions 11 (source, drain) and $p^+$-type semiconductor regions 12 (source, drain), are dry-etched to form contact holes 17, and a metal plug 18 is formed inside the contact hole 17. These steps are the same as those steps shown in FIGS. 1 to 4 with respect to Embodiment 1.

Figure 17:
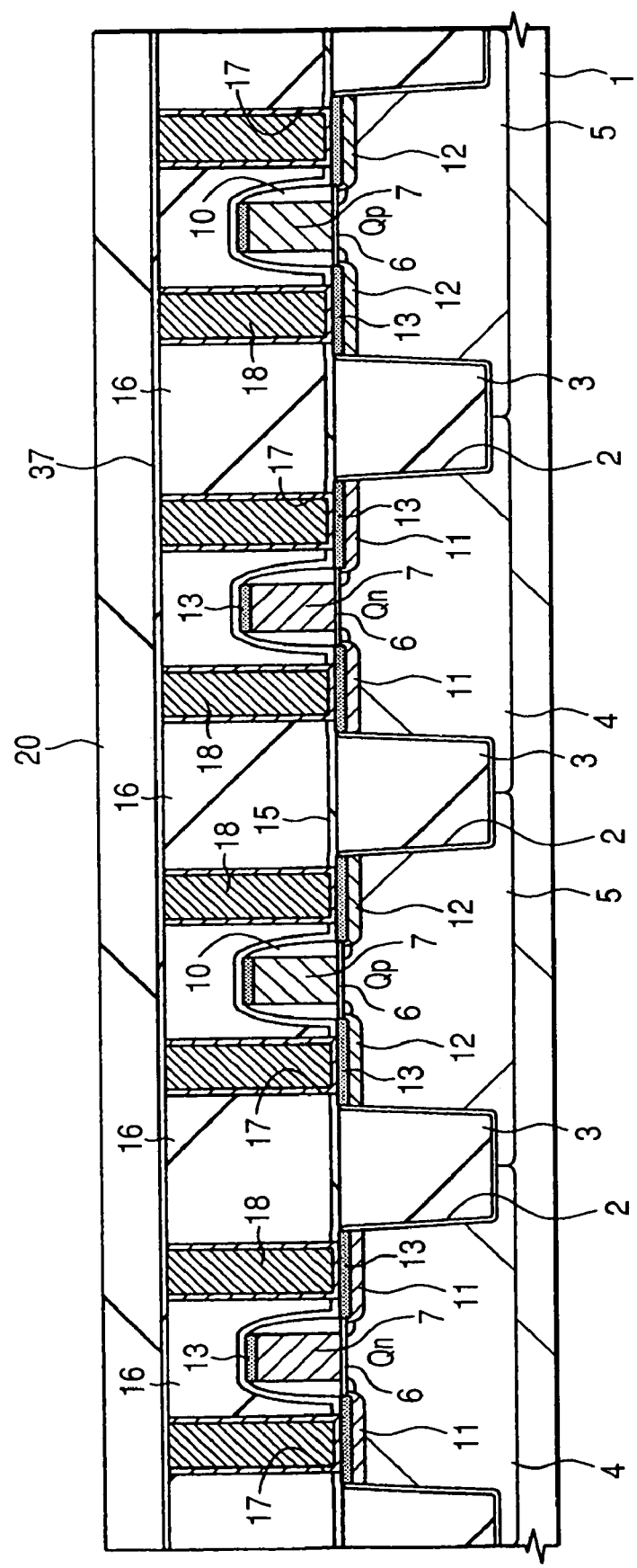
FIG. 17 is a sectional view of a part of a semiconductor substrate showing a step in the method of manufacture of a semiconductor integrated circuit device according to a second embodiment of the invention.

Next, as shown in FIG. 17, an SiC film 37 and an SiOF film 20 are successively deposited on the silicon oxide film 16. Although, in Embodiment 1, the etching stopper film is constituted of a silicon nitride film, an SiC film 37 is used for this purpose in this embodiment. An SiCN film may be used in place of the SiC film. While a silicon nitride film has a relative dielectric constant of about 7, the relative dielectric constant of an SiC film or an SiCN film is about 5. Accordingly, when the etching stopper layer is constituted of an SiC film or an SiCN film in place of a silicon nitride film, the capacitance of an interlayer insulating film provided between wirings can be reduced. The SiC film is deposited by a CVD method using a mixed gas of trimethylsilane and helium (He), and the SiCN film is deposited by a CVD method using a mixed gas of trimethylsilane, He and ammonia (or nitrogen). Mono, di or tetramethylsilane may be used in place to trimethylsilane.

Although in Embodiment 1, the silicon oxynitride film (21) is deposited over the SiOF film 20, a silicon oxynitride film is not used in this embodiment.

Figure 18:
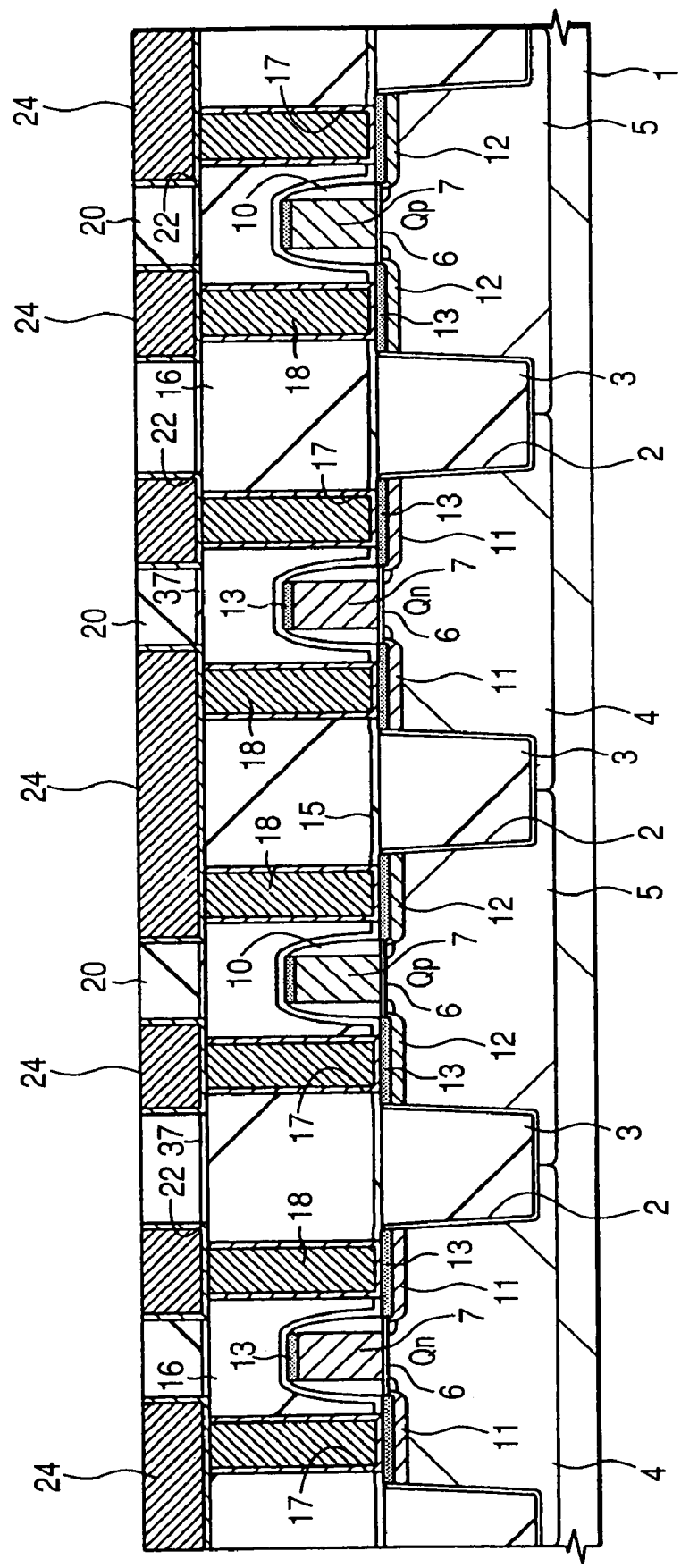
FIG. 18 is a sectional view of a part of a semiconductor substrate showing a step in the method of manufacture of a semiconductor integrated circuit device according to the second embodiment of the invention.

Next, as shown in FIG. 18, the SiOF film 20 and the SiC film 37 are dry-etched to form the wiring groove 22 over the contact hole 17, and this is followed by formation of a first-layer Cu wiring 24 in the wiring groove 22 in the same manner as in Embodiment 1.

Figure 19:
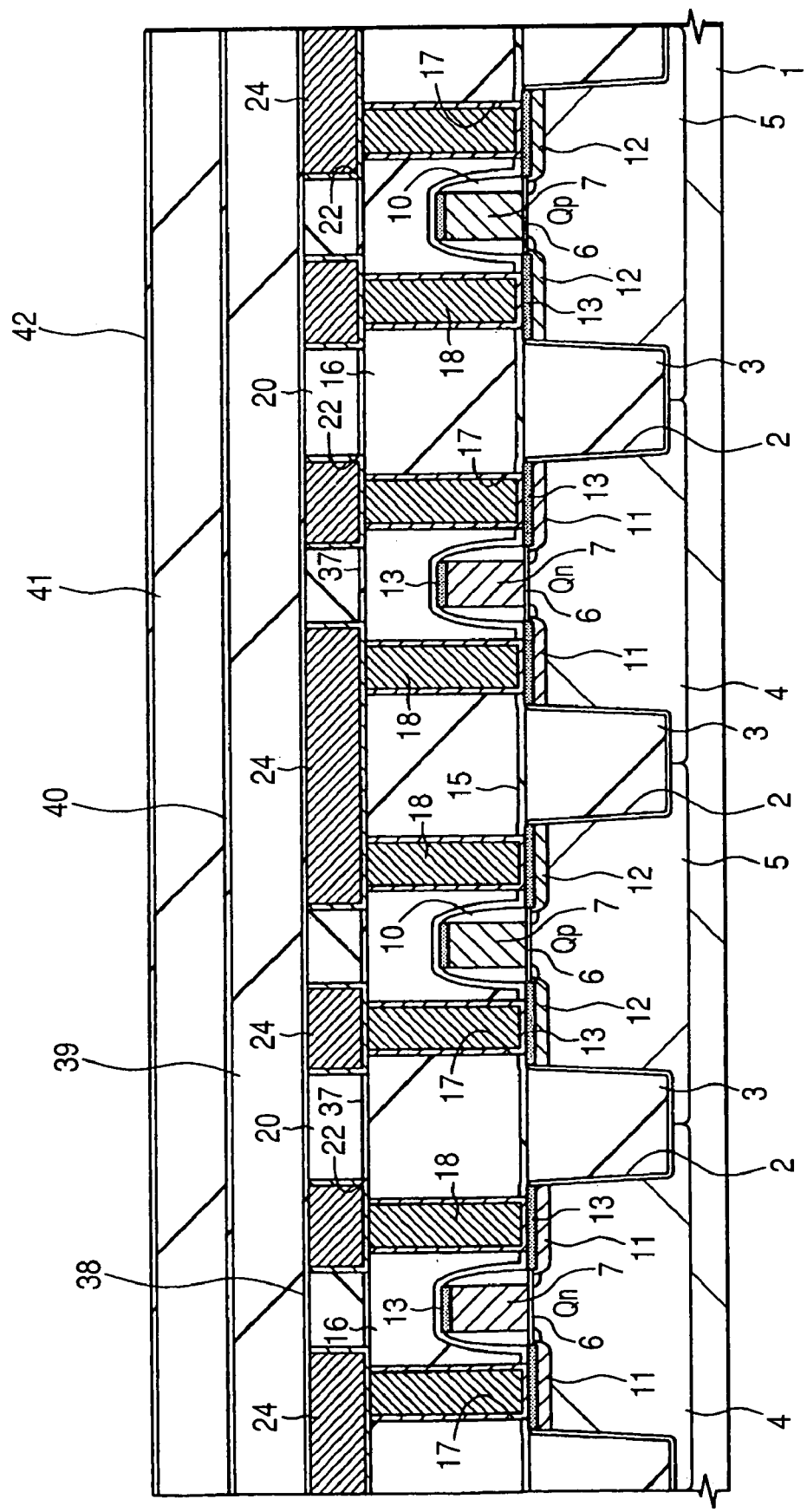
FIG. 19 is a sectional view of a part of a semiconductor substrate showing a step in the method of manufacture of a semiconductor integrated circuit device according to a second embodiment of the invention.

Thereafter, as shown in FIG. 19, an SiC film 38, an SiOF film 39, an SiC film 40, an SiOF film 41 and an SiC film 42 are successively deposited over the Cu wiring 24 by a CVD method. It will be noted that the SiC films 38, 40, 42 may be replaced by the afore-mentioned SiCN film. After deposition of the SiC film 40, this film 40 is slightly polished by a chemical mechanical polishing method, prior to the step of depositing the SiOF film 41, so as to flatten the surface thereof. In the course of carrying out the chemical mechanical polishing of the SiC film 40, where there is concern that part of the lower SiOF film 39 will be exposed depending on the variation in abrasion in the in-plane surface of a wafer, the SiOF film 39 may be polished on the surface thereof after deposition thereof, followed by deposition of the SiC film 40 on the SiOF film 39. The flattening of the surface of the SiC film 40 or the SiOF film 39 ensures a substantially uniform surface altitude and thickness of the SiOF film 41 within the in-plane surface of the wafer, so that the thickness of the Cu wiring buried inside the wiring groove formed in a subsequent step, i.e. the resistance of the Cu wiring, can be made substantially uniform within the in-plane surface of the wafer.

The SiC film 38 functions as a diffusion barrier layer for preventing Cu in the Cu wiring 24 from diffusing into the SiOF film 39. The SiC film 42 functions as a mask when a wiring groove is formed in a subsequent step, and the SiC film 40 serves as an etching stopper layer. More particularly, according to this embodiment, the etching stopper layer is formed of the SiC film or SiCN film when the SiOF films 39,41 are dry etched to form a wiring groove, for which bonding at the interfaces between the SiOF films 39, 41 and the etching stopper layer (SiC film 40) and the mask (42) is improved. Moreover, because the diffusion barrier layer provided over the SiOF film 20, in which the first-layer Cu wiring 24 has been formed, is constituted of the SiC film 38, bonding at the interface between the SiOF film 20 and the diffusion barrier layer (SiC film 38) can be improved.

The reason why bonding at the interface between the SiOF film and the SiC film is good is believed to be as follows: the SiC film deposited by a CVD method is porous. More particularly, it is believed that free F generated in the SiOF film diffuses through the porous SiC film and is unlikely to be trapped at the interface between the SiOF film and the SiC film. In addition, the SiCN film is also porous and similar effects may be expected.

Figure 20:
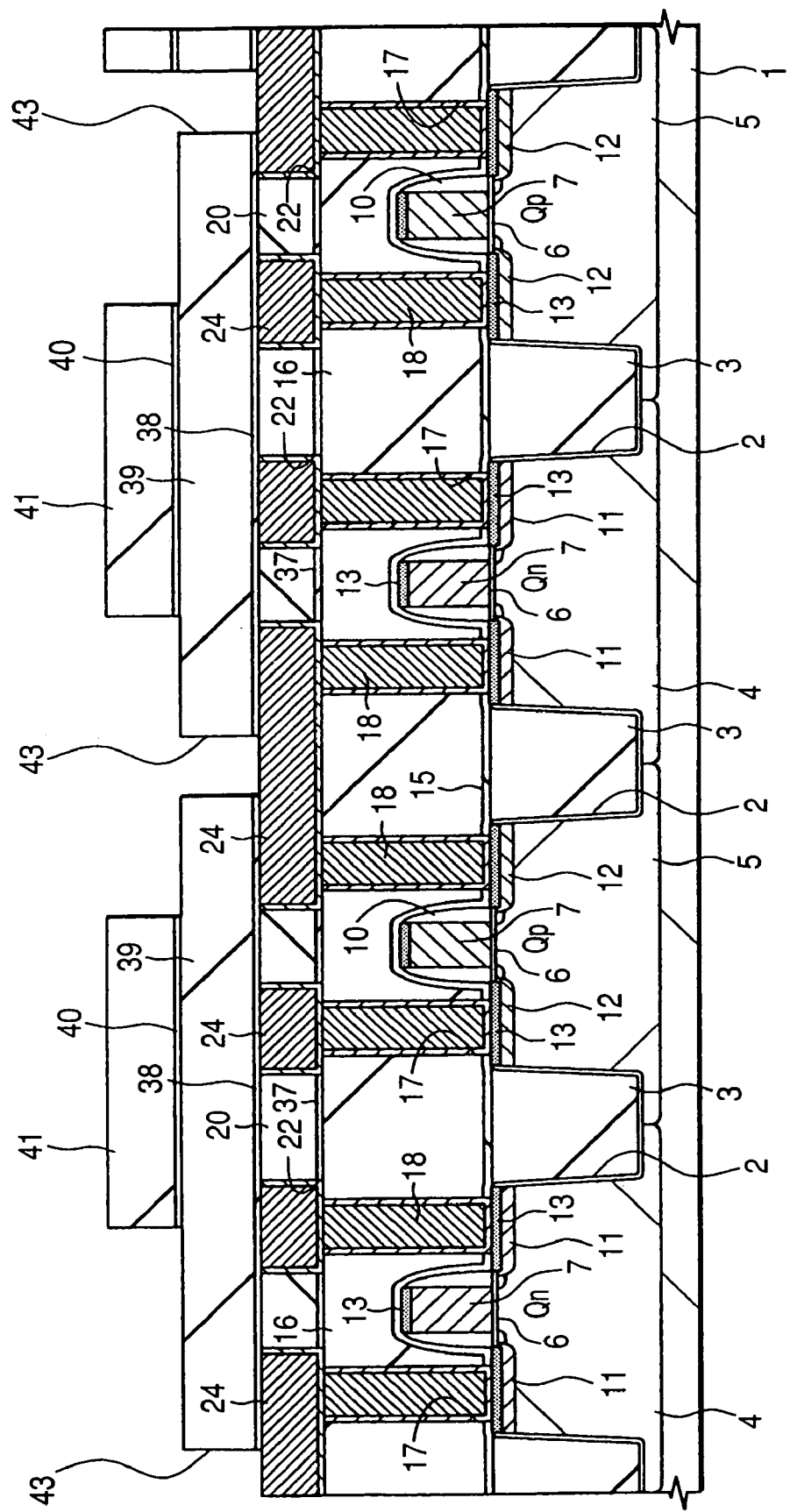
FIG. 20 is a sectional view of a part of a semiconductor substrate showing a step in the method of manufacture of a semiconductor integrated circuit device according to a second embodiment of the invention.

Next, as shown in FIG. 20, a wiring groove 43 is formed over the Cu wiring 24 by dry etching in the same manner as in Embodiment 1, using a photoresist film (not shown) and the SiC film 42 as a mask, and this is followed by forming a second-layer Cu wiring 44 inside the wiring groove 43, as shown in FIG. 21.

In this embodiment, the etching stopper layer is formed of the SiC film (or the SiCN film), thereby improving bonding at the interface with the SiOF film. In this connection, however, the silicon oxynitride film 27 used in Embodiment 1 may be interposed between the SiC film 40 serving as the etching stopper layer and the lower SiOF film 39.

The invention has been described particularly based on various embodiments of the invention, which should not be construed as limiting the scope of the invention, and many variations and alterations may be possible without departing from the spirit of the invention.

The effects obtained by typical embodiments of the invention are finally summarized below.

For the formation of a groove for buried wiring by dry etching, an interlayer insulating film including an SiOF film, a silicon oxynitride film is interposed between a silicon nitride film serving as an etching stopper layer for dry etching and an SiOF film, so that free F generated in the SiOF film is trapped in the silicon oxynitride, thereby improving bonding at the interface between the etching stopper layer and the SiOF film.

What is claimed is:

1. A semiconductor integrated circuit device comprising a semiconductor substrate, a first insulating film formed on a main surface of said semiconductor substrate and made of fluorine-containing silicon oxide, a first wiring formed inside said first insulating film, a second insulating film formed over said first insulating film and said first wiring, respectively, and made of silicon nitride, and a third insulating film interposed between said first insulating film and said second insulating film and made of nitrogen-containing silicon oxide, wherein the third insulating film is in contact with both said first insulating film and said second insulating film.

2. A semiconductor integrated circuit device according to claim 1, wherein said third insulating film has a ratio of silicon to oxygen and nitrogen which is stoichiometrically in excess.

3. A semiconductor integrated circuit device according to claim 1, wherein said third insulating film has a nitrogen concentration of 5 atom percent or below.

4. A semiconductor integrated circuit device according to claim 1, wherein said third insulating film has a thickness of 50 nm or below.

5. A semiconductor integrated circuit device according to claim 1, wherein said first wiring is made of a conductive layer containing copper as a main component.

6. A semiconductor integrated circuit device according to claim 1, further comprising, over said second insulating film, an interlayer insulating film including a fourth insulating film made of fluorine-containing silicon oxide, a fifth insulating film made of silicon nitride, and a sixth insulating film interposed between said fourth insulating film and said fifth insulating film and made of nitrogen-containing silicon oxide, and a second wiring provided inside said interlayer insulating film and electrically connected to said first wiring, wherein said first wiring of a region except for a connection with said second wiring is covered on the surface thereof with a seventh insulating film.

7. A semiconductor integrated circuit device according to claim 6, further comprising an eighth insulating film interposed between said second insulating film and said fourth insulating film and made of nitrogen-containing silicon oxide.

8. A semiconductor integrated circuit device comprising a semiconductor substrate, a first insulating film formed on a main surface of said semiconductor substrate and made of fluorine-containing silicon oxide, a first wiring formed inside said first insulating film, a second insulating film formed over said first insulating film and said first wiring, respectively; and made of Sic or SiCN, and a third insulating film interposed between said first insulating film and said second insulating film and made of nitrogen-containing silicon oxide, wherein the third insulating film is in contact with both said first insulating film and said second insulating film.

9. A semiconductor integrated circuit device according to claim 8, wherein said third insulating film has a ratio of silicon to oxygen and nitrogen which is stoichiometrically in excess.

10. A semiconductor integrated circuit device according to claim 8, wherein said third insulating film has a nitrogen concentration of 5 atom percent or below.

11. A semiconductor integrated circuit device according to claim 8, wherein said third insulating film has a thickness of 50 nm or below.

12. A semiconductor integrated circuit device according to claim 8, wherein said first wiring is made of a conductive layer containing copper as a main component.

13. A semiconductor integrated circuit device according to claim 8, further comprising, over said second insulating film, an interlayer insulating film including a fourth insulating film made of fluorine-containing silicon oxide, a fifth insulating film made of SiC or SiCN, and a sixth insulating film interposed between said fourth insulating film and said fifth insulating film and made of nitrogen-containing silicon oxide, and a second wiring provided inside said interlayer insulating film and electrically connected to said first wiring, wherein said first wiring of a region except for a connection with said second wiring is covered on the surface thereof with a seventh insulating film made of SiC or SiCN.

14. A semiconductor integrated circuit device according to claim 13, further comprising an eighth insulating film interposed between said second insulating film and said fourth insulating film and made of SiC or SiCN.

* * * * *